(12) United States Patent
Aradhya et al.

(10) Patent No.: US 10,333,058 B2
(45) Date of Patent: Jun. 25, 2019

(54) NANOSECOND-TIMESCALE LOW-ERROR SWITCHING OF 3-TERMINAL MAGNETIC TUNNEL JUNCTION CIRCUITS THROUGH DYNAMIC IN-PLANE-FIELD ASSISTED SPIN-HALL EFFECT

(71) Applicant: Cornell University, Ithaca, NY (US)

(72) Inventors: Sriharsha V. Aradhya, Fremont, CA (US); Robert A. Buhrman, Ithaca, NY (US); Daniel C. Ralph, Ithaca, NY (US); Graham E. Rowlands, Ithaca, NY (US)

(73) Assignee: Cornell University, Ithaca, NY (US)

( * ) Notice: Subject to any disclaimer, the term of this patent is extended or adjusted under 35 U.S.C. 154(b) by 0 days.

(21) Appl. No.: 15/462,760

(22) Filed: Mar. 17, 2017

(65) Prior Publication Data
US 2018/0033954 A1    Feb. 1, 2018

Related U.S. Application Data

(60) Provisional application No. 62/309,875, filed on Mar. 17, 2016.

(51) Int. Cl.
*G11C 11/00*    (2006.01)
*H01L 43/06*    (2006.01)
(Continued)

(52) U.S. Cl.
CPC ............ *H01L 43/06* (2013.01); *G11C 11/161* (2013.01); *G11C 11/1659* (2013.01);
(Continued)

(58) Field of Classification Search
CPC .................................................... G11C 11/18
(Continued)

(56) References Cited

U.S. PATENT DOCUMENTS 9,105,832 B2    8/2015    Buhrman et al.
9,230,626 B2    1/2016    Buhrman et al.
(Continued)

FOREIGN PATENT DOCUMENTS

WO    2015102739 A3    7/2015
WO    2016011435 A1    1/2016

OTHER PUBLICATIONS

Brataas, A. et al., "Current-induced torques in magnetic materials", Nat. Mater, vol. 11, 2012, pp. 372-381.
(Continued)

*Primary Examiner* — Hoai V Ho
(74) *Attorney, Agent, or Firm* — Perkins Coie LLP

(57) ABSTRACT

The disclosed technology provides various implementations of a device based on a spin Hall effect (SHE) and spin transfer torque (STT) effect. In one aspect, a device is provided to include a magnetic structure including a ferromagnetic layer having a magnetization direction that can be changed by spin transfer torque; a SHE layer that is electrically conducting and exhibits a spin Hall effect to, in response to an applied charge current, generate a spin-polarized current that is perpendicular to the applied charge current, the SHE layer located adjacent to the ferromagnetic layer to inject the spin-polarized current into the ferromagnetic layer; a first electrical contact in contact with the magnetic structure; a second electrical contact in contact with a first location of the SHE layer; a third electrical contact in contact with a second location of the SHE layer so that the first and second locations are on two opposite sides of the magnetic structure; a magnetic structure circuit coupled between the first electrical contact and one of the second and third electrical contacts to supply a current or a voltage to the magnetic structure; and a charge current circuit coupled between the second and third electrical contacts to supply the charge current into the SHE layer,
(Continued)

wherein the device is operable at a low write error rate with pulses of a pulse duration of around 2 ns or shorter to switch a direction of the magnetization direction of the ferromagnetic layer in the magnetic structure.

29 Claims, 22 Drawing Sheets

(51) Int. Cl.
| | |
|---|---|
| H01L 43/10 | (2006.01) |
| H01L 27/22 | (2006.01) |
| H03K 17/90 | (2006.01) |
| H01F 10/32 | (2006.01) |
| H03B 15/00 | (2006.01) |
| H01L 43/04 | (2006.01) |
| G11C 11/16 | (2006.01) |
| G11C 11/18 | (2006.01) |
| H01L 43/08 | (2006.01) |
| H01F 10/30 | (2006.01) |
| H01F 41/32 | (2006.01) |

(52) U.S. Cl.
CPC ...... *G11C 11/1673* (2013.01); *G11C 11/1675* (2013.01); *G11C 11/1693* (2013.01); *G11C 11/18* (2013.01); *H01F 10/30* (2013.01); *H01F 10/329* (2013.01); *H01F 10/3272* (2013.01); *H01L 27/226* (2013.01); *H01L 43/04* (2013.01); *H01L 43/08* (2013.01); *H01L 43/10* (2013.01); *H03B 15/006* (2013.01); *H03K 17/90* (2013.01); *H01F 41/325* (2013.01)

(58) Field of Classification Search
USPC ........................................... 365/158
See application file for complete search history.

(56) References Cited

U.S. PATENT DOCUMENTS

| | | | | |
|---|---|---|---|---|
| 2012/0205763 | A1* | 8/2012 | Ranjan | B82Y 10/00 257/421 |
| 2014/0099735 | A1* | 4/2014 | Horng | C23C 14/3414 438/3 |
| 2014/0169088 | A1* | 6/2014 | Buhrman | G11C 11/18 365/158 |
| 2014/0264511 | A1* | 9/2014 | De Brosse | H01L 43/065 257/295 |
| 2014/0312441 | A1* | 10/2014 | Guo | H01L 43/04 257/427 |
| 2015/0200003 | A1* | 7/2015 | Buhrman | G11C 11/18 365/158 |
| 2015/0372687 | A1 | 12/2015 | Buhrman et al. | |
| 2016/0232959 | A1* | 8/2016 | Lee | G11C 11/1673 |
| 2017/0077392 | A1* | 3/2017 | Han | H01L 43/065 |
| 2017/0125078 | A1* | 5/2017 | Mihajlovic | G11C 11/161 |

OTHER PUBLICATIONS

Chappert, C. et al. "The emergence of spin electronics in data storage", Nat. Mater, vol. 6, pp. 813-823.
Cubukcu, M. et al., "Spin-orbit torque magnetization switching of a three-terminal perpendicular magnetic tunnel function", Appl. Phys. Lett., vol. 104, 2014, p. 042406.
Dyakonov, M. I., "Current-induced spin orientation of electrons in semiconductors", Phys. Left., vol. 35A, 1971, pp. 159-460.
Fan, Y. et al., "Magnetization switching through giant spin-orbit torque in a magnetically doped topological insulator heterostructure", Nat. Mater, vol. 13, 2014, pp. 699-704.
Garello, K. et al., Ultrafast magnetization switching by spin-orbit torques. Appl. Phys. Lett., vol. 105, 2014, p. 212402.
Heindl, R. et al., "Physical limitations to efficient high-speed spin-torque switching in magnetic tunnel junctions", Phys. Rev. B, vol. 83, 2011, p. 054430.
Hirsch, J., "Spin Hall Effect", Phys. Rev. Lett., vol. 83, 1999, pp. 1-7.
Hung, et al., "Quasistatic and Pulsed Current-Induced Switching With Spin-Orbit Torques in Ultrathin Films With Perpendicular Magnetic Anisotropy", IEEE Magn. Lett., vol. 6, 2015, pp. 1-4.
Kent, A.D. et al., "A new spin on magnetic memories", Nat. Nanotechnol, vol. 10, 2015, pp. 187-191.
Lee, et al., "Write error rate slopes of in-plane magnetic tunnel junctions", IEEE Magn. Lett., vol. 3, 2012, pp. 3-6.
Liu, L. et al., "Current-Induced Switching of Perpendicularly Magnetized Magnetic Layers Using Spin Torque from the Spin Hall Effect", Phys. Rev, Lett. vol. 109, 2012, p. 096602.
Liu, H. et al., "Ultrafast switching in magnetic tunnel junction based orthogonal spin transfer devices", Appl. Phys. Lett., vol. 97, 2010, p. 242510.
Lui, L. et al., "Spin-torque switching with the giant spin Hall effect of tantalum", Science, vol. 336, 2012, pp. 555-558.
Mellnik, A.R. et al., "Spin-transfer torque generated by a topological insulator", Nature vol. 511, 2014, pp. 449-451.
Min, T. et al, "A Study of Write Margin of Spin Torque Transfer Magnetic Random Access Memory Technology", IEEE Trans. Magn, vol. 46, 2010, pp. 2322-2327.
Miron, I. M. et al., "Perpendicular switching of a single ferromagnetic layer induced by in-plane current injection", Nature 476, 2011, pp. 189-193.
Myers, E. B. et al., "Thermally Activated Magnetic Reversal Induced by a Spin-Polarized Current", Phys. Rev. Lett., vol. 89, 2002, p. 196801.
Nguyen, M.-H. et al., "Enhancement of the anti-damping spin torque efficacy of platinum by interface modification", Appl. Phys. Lett., vol. 106, 2015, p. 222402.
Nowak, J. J. et al., "Demonstration of ultralow bit error rates for spin-torque magnetic random-access memory with perpendicular magnetic anisotropy", IEEE Magn. Lett., vol. 2, 2011, pp. 2-5.
Pai, C.-F. et al., "Spin transfer torque devices utilizing the giant spin Hall effect of tungsten", Appl. Phys. Lett., vol. 101, 2012, p. 122404.
Rizzo, N. D. et al., "A Fully Functional 64 Mb DDR3 ST-MRAM Built on 90 nm CMOS Technology", IEEE Trans. Magn., vol. 49, 2013, pp. 4441-4446.
Rowlands, G. E. et al., "Nanosecond magnetization dynamics during spin Hall switching of in-plane magnetic tunnel functions", Applied Physics Letters, 110, 2017, pp. 122402.
Sun, J., "Spin-current interaction with a monodomain magnetic body: A model study", Phys. Rev. B, vol. 62, 2000, pp. 570-578.
Thomas, L. et al., "Perpendicular spin transfer torque magnetic random access memories with high spin torque efficiency and thermal stability for embedded applications", J. Appl. Phys., vol. 115, 2014, pp. 172615.
Yamanouchi, M. et al., "Three terminal magnetic tunnel junction utilizing the spin Hall effect of iridium-doped copper Three terminal magnetic tunnel junction utilizing the spin Hall effect of iridium-doped copper", Appl. Phys. Lett., vol. 102, 2013, p. 212408.
Dmytro, C., "High Frequency Behaviour of Magnetic Thin Film Elements for Microelectronics", (TU Dresden, Ph.D. Thesis, 2006).

* cited by examiner

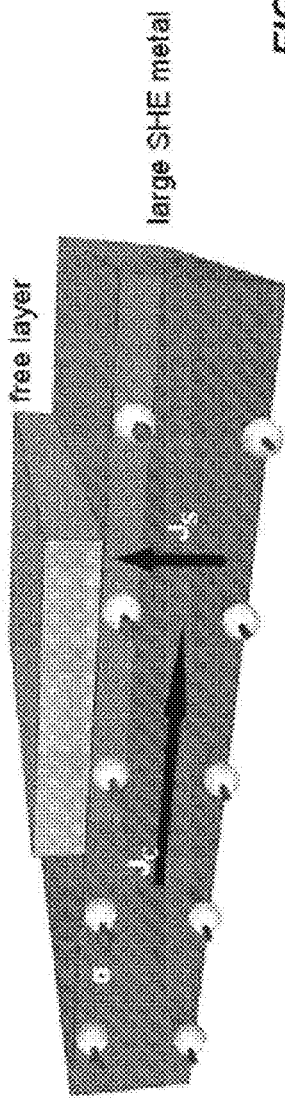
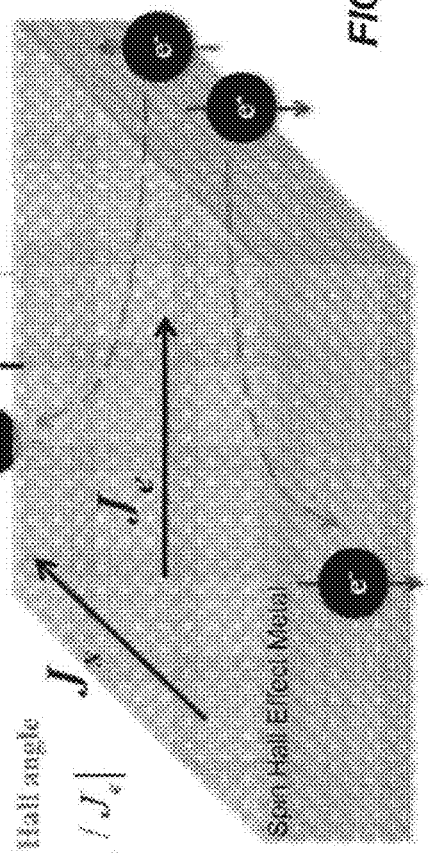
FIG. 3A
FIG. 3B

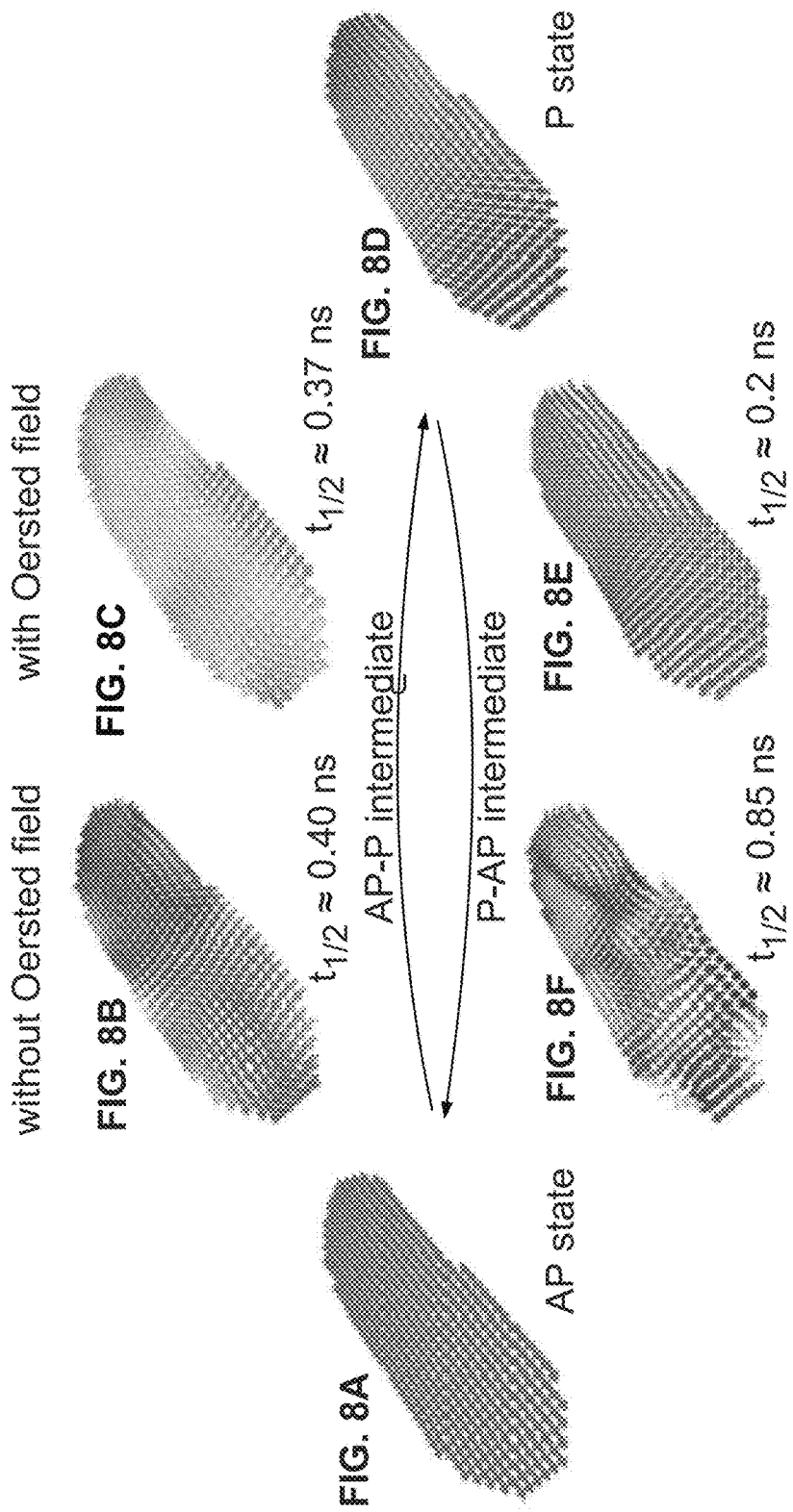

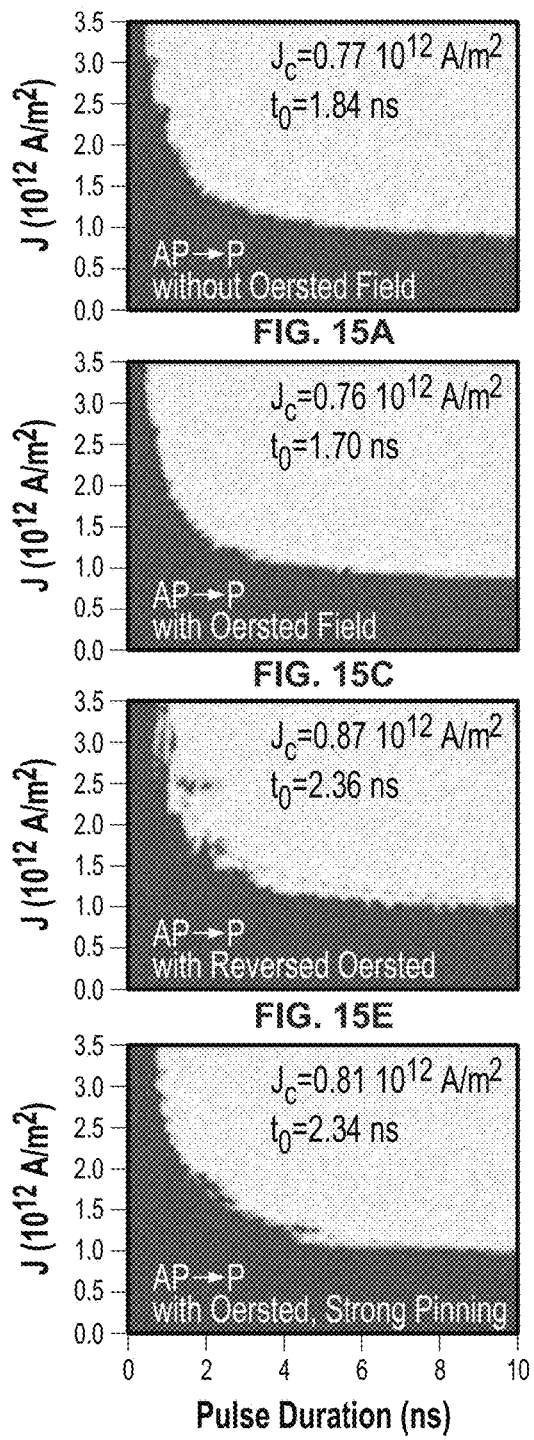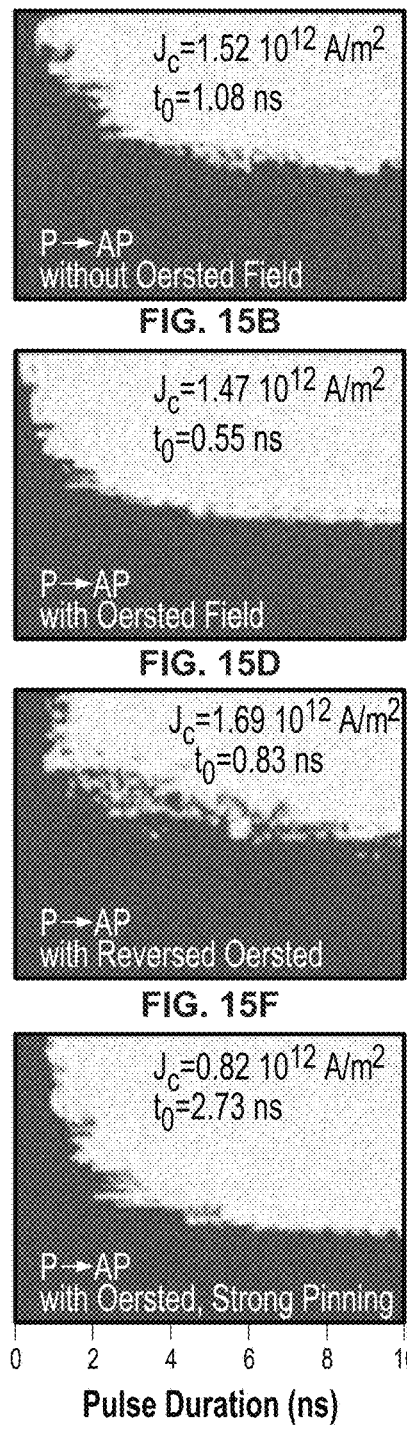
FIG. 15A FIG. 15B FIG. 15C FIG. 15D FIG. 15E FIG. 15F FIG. 15G FIG. 15H

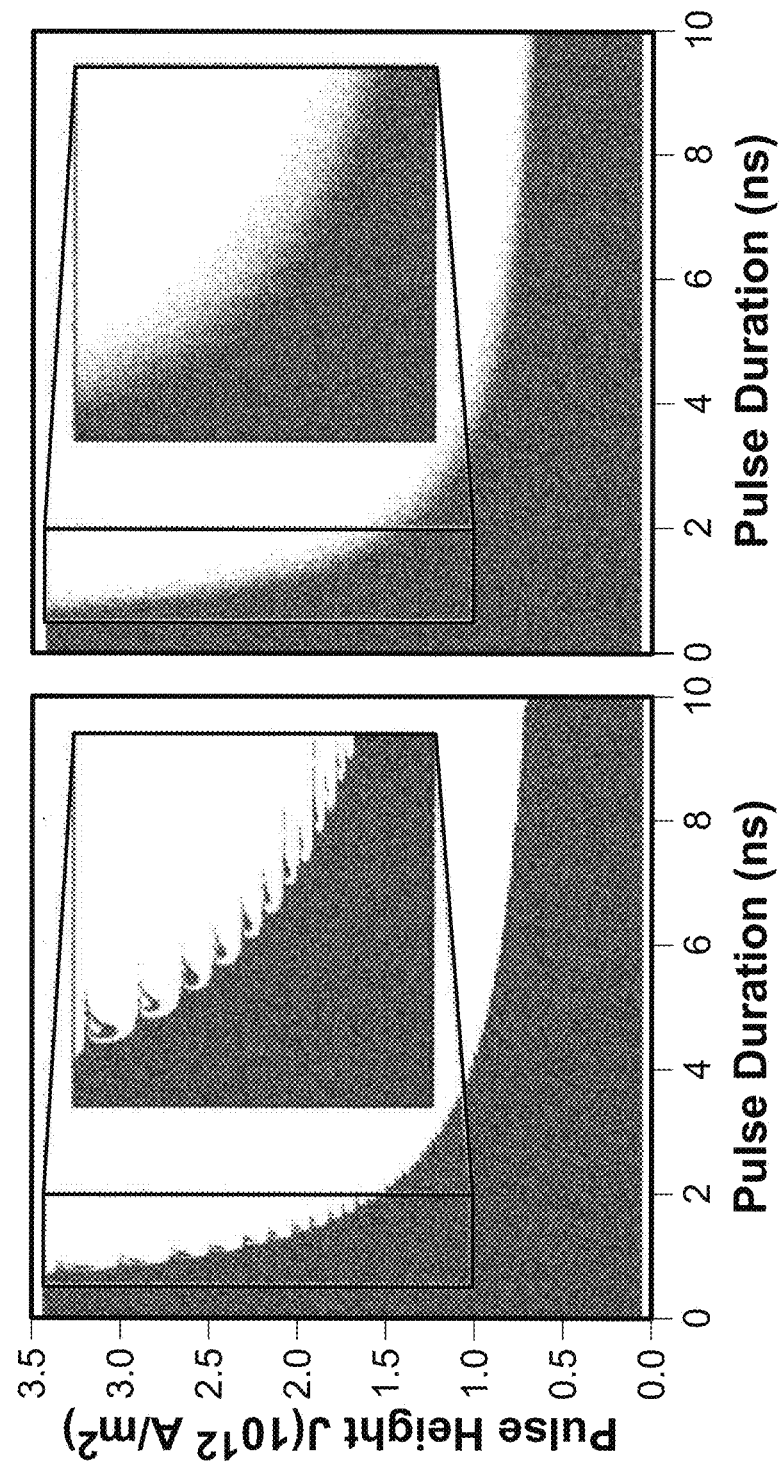

NANOSECOND-TIMESCALE LOW-ERROR SWITCHING OF 3-TERMINAL MAGNETIC TUNNEL JUNCTION CIRCUITS THROUGH DYNAMIC IN-PLANE-FIELD ASSISTED SPIN-HALL EFFECT

PRIORITY CLAIM AND RELATED PATENT APPLICATION INFORMATION

This patent document claims the priority and benefits of U.S. Provisional Patent Application No. 62/309,875 entitled "NANOSECOND-TIMESCALE LOW-ERROR SWITCHING OF 3-TERMINAL MAGNETIC TUNNEL JUNCTION CIRCUITS THROUGH DYNAMIC OERSTED-FIELD ASSISTED SPIN-HALL EFFECT" and filed on Mar. 17, 2016, the entirety of which is incorporated by reference.

STATEMENT REGARDING FEDERALLY SPONSORED RESEARCH OR DEVELOPMENT

This invention was made with government support by the Department of Defense (DoD) Agency-Intelligence Advanced Research Projects Activity (IARPA) through the U.S. Army Research Office under Grant W911NF-14-C-0089 and by the National Science Foundation (NSF) under Grant ECCS-1542081. The government has certain rights in the invention.

TECHNICAL FIELD

This patent document relates to circuits and devices having magnetic materials or structures based on electron spin torque effects and their applications, including non-volatile magnetic memory circuits, non-volatile logic devices, and spin-torque excited nanomagnet oscillators.

BACKGROUND

Electrons and other charged particles process spins as one of their intrinsic particle properties and such a spin is associated with a spin angular momentum. A spin of an electron has two distinctive spin states. Electrons in an electrical current may be unpolarized by having equal probabilities in the two spin states. The electrons in an electrical current are spin polarized by having more electrons in one spin state than electrons in the other spin state. A spin-polarized current can be achieved by manipulating the spin population via various methods, e.g., by passing the current through a magnetic layer having a particular magnetization. In various magnetic microstructures, a spin-polarized current can be directed into a magnetic layer to cause transfer of the angular momenta of the spin-polarized electrons to the magnetic layer and this transfer can lead to exertion of a spin-transfer torque (STT) on the local magnetic moments in the magnetic layer and precession of the magnetic moments in the magnetic layer. Under a proper condition, this spin-transfer torque can cause a flip or switch of the direction of the magnetization of the magnetic layer.

The above spin-transfer torque (STT) effect can be used for various applications including STT magnetic random access memory (MRAM) circuits and devices. For example, a STT-MRAM circuit can include a magnetic tunnel junction (MTJ) as a magnetoresistive element formed of two or more thin film ferromagnetic layers or electrodes, which are usually referred to as the free magnetic layer (FL) having a magnetic moment whose magnetic orientation direction can be switched or changed and the pinned magnetic layer (PL) whose magnetic moment is fixed in direction. The free magnetic layer (FL) and the pinned magnetic layer (PL) are separated by an insulating barrier layer (e.g., a MgO layer) that is sufficiently thin to allow electrons to transit through the barrier layer via quantum mechanical tunneling when an electrical bias voltage is applied between the electrodes. The electrical resistance across the MTJ depends upon the relative magnetic orientations of the PL and FL layers. The magnetic moment of the FL can be switched between two stable orientations in the FL. The resistance across the MTJ exhibits two different values under the two relative magnetic orientations of the PL and FL layers, which can be used to represent two binary states "1" and "0" for binary data storage, or, alternatively, for binary logic applications. The magnetoresistance of this element is used to read out this binary information from the memory or logic cell.

SUMMARY

The technology disclosed in this document and various associated aspects of devices or circuits based on the disclosed technology are based on STT and Spin Hall effects by coupling a spin Hall effect (SHE) metal layer to a free magnetic layer in a multilayer magnetic structure for various applications in 3-terminal magnetic circuits and devices. The free magnetic layer exhibits a magnetization that can be switched or changed in a controlled manner. The disclosed 3-terminal magnetic circuits and devices can be configured by using a combination of injection of spin-polarized electrons or charged particles by using a charge current in a spin Hall effect metal layer coupled to a free magnetic layer and, in some implementations, application of a gate voltage to the free magnetic layer across the multilayer magnetic structure to manipulate the magnetization of the free magnetic layer. In the disclosed 3-terminal devices, the charge current in the spin Hall effect metal layer produces both a transverse spin current that impinges onto the switchable free magnetic layer and, in addition, an Oersted magnetic field whose direction is generally in the plane of the switchable free magnetic layer across the plane of the switchable free magnetic layer. Thus this Oersted magnetic field is oriented differently from a circularly symmetric Oersted magnetic field in the plane of the switchable free magnetic layer generated by a current flowing in a direction perpendicular to the free magnetic layer. The spin Hall effect metal layer and the magnetic structure containing the free magnetic layer coupled to the spin Hall effect metal layer can be structured by selecting, e.g., their material compositions to leverage the presence of the Oersted magnetic field produced by the charge current in the spin Hall effect metal layer to improve the switching operation of the free magnetic layer under the injection of spin-polarized electrons or charged particles by the charge current in the spin Hall effect metal layer and an applied gate voltage to the free magnetic layer across the magnetic structure. The charge current is applied to the spin Hall effect metal layer via first and second electrical terminals and the gate voltage is applied between a third electrical terminal and either of the first and second electrical terminals. The spin Hall effect metal layer can be adjacent to the free magnetic layer or in direct contact with the free magnetic layer to allow a spin-polarized current generated via a spin Hall effect under the charge current to enter the free magnetic layer. The disclosed technology and associated 3-terminal devices can be used in various applications, including non-volatile memory functions, logic functions, generation of oscillation signal and others.

Magnetic random access memory (MRAM) based on spin transfer torque (STT) may be used to provide MRAM memory chips for replacing existing best-in-class memory technologies in several application domains. However, research on conventional 2-terminal STT-MRAM magnetic tunnel junctions (MTJs) thus far has revealed the existence of both practical and fundamental limitations that constrain their switching speeds and reliability of operation, which are important metrics for commercial applications. Spin torque arising from spin-orbit effects, particularly the giant spin Hall effect in certain spin Hall effect metals (e.g., Ta, W and Pt) can be used as an efficient mechanism to switch magnetic bits in a three-terminal MTJ geometry. Sample 3-terminal devices constructed based on the disclosed technology with in-plane-magnetized MTJs were tested to perform pulse switching with write error rates (WER) down to $10^{-5}$ using current pulses as short as 2 ns in duration. This result represents possibly the fastest reliable switching demonstrated to date in magnetic memory devices where the tunnel barrier is not subjected to current density levels so high that the barrier will be degraded or destroyed during extended, repeated memory writing operations. Conducted micromagnetic simulations show that, in 3-terminal spin-Hall devices based on the disclosed technology, the magnetic field generated by the pulse current significantly modifies the magnetic dynamics, enabling this unanticipated performance improvement.

In one aspect, a device based on a spin Hall effect (SHE) and spin transfer torque (STT) effect is provided to include a magnetic structure including a ferromagnetic layer having a magnetization direction that can be changed by spin transfer torque; a SHE layer that is electrically conducting and exhibits a spin Hall effect to, in response to an applied charge current, generate a spin-polarized current that is perpendicular to the applied charge current, the SHE layer located adjacent to the ferromagnetic layer to inject the spin-polarized current into the ferromagnetic layer; a first electrical contact in contact with the magnetic structure; a second electrical contact in contact with a first location of the SHE layer; a third electrical contact in contact with a second location of the SHE layer so that the second and third locations are on two opposite sides of the magnetic structure; a magnetic structure circuit coupled between the first electrical contact and one of the second and third electrical contacts to supply a current or a voltage to the magnetic structure; and a charge current circuit coupled between the second and third electrical contacts to supply the charge current into the SHE layer. The device is operable at a low write error rate with pulses of a pulse duration of around 2 ns or shorter to switch the direction of the magnetization direction of the ferromagnetic layer in the magnetic structure.

In some implementations, the device further comprises: a first transistor connected to the first electrical contact and the second electrical contact and configured to be operable in a writing mode; and a second transistor connected to the second electrical contact and the third electrical contact and configured to be operable in a read mode. In some implementations, the SHE layer includes a heavy metal with a spin Hall angle that allows to change the magnetization direction of the ferromagnetic layer within few tens of nanosecond switching time. In some implementations, the SHE layer includes platinum (Pt), tantalum (Ta), or tungsten (W), or an alloy of Pt, Ta, or W, or a compound of Pt, Ta, or W. In some implementations, the SHE layer includes PtMn, PtCr, PtZr, PtTa, PtNb, or PtZr. In some implementations, the device further includes a metallic insertion layer formed between the SHE layer and the ferromagnetic layer and having a thickness of less than approximately one to four atomic layers. In some implementations, the metallic insertion layer includes Hf, Y, Al, Zr, Ti, Mo or Nb. In some implementations, the magnetic structure further includes a reference layer having a fixed magnetization direction and a non-magnetic layer disposed between the ferromagnetic layer and the reference layer. In some implementations, the reference layer includes a synthetic antiferromagnetic (SAF) structure. In some implementations, the reference layer is pinned by an adjacent antiferromagnetic layer. In some implementations, the ferromagnetic layer has a micromagnetic non-uniformity reduced as compared to when there is no spin-polarized current injected into the ferromagnetic layer.

In another aspect, a device based on a spin Hall effect (SHE) and spin transfer torque (STT) effect, comprising: a magnetic tunneling junction (MTJ) structure including a first magnetic layer having a fixed magnetization direction, a second magnetic layer having a changeable magnetization direction, and a non-magnetic junction layer between the first magnetic layer and the second magnetic layer; and a SHE layer formed adjacent to the second magnetic layer and including a spin Hall effect material with strong spin orbit coupling sufficient to generate a spin current and apply a spin transfer torque effect to the second magnetic layer under a given charge current applied into the SHE layer, wherein the spin Hall effect material includes a heavy metal with a spin Hall angle that affects an orientation of an in-plane effective field generated by the spin current to change the magnetization direction of the second magnetic layer within tens of nanosecond switching time.

In some implementations, the choice of the spin Hall effect material is to cause in-plane effective magnetic field to be in the direction more or less opposite to an in-plane coercive field of the second magnetic layer. In some implementations, the device further includes an insertion layer disposed between the SHE layer and the second magnetic layer to provide an optimized interface for the change of the magnetization direction of the second magnetic layer. In some implementations, the choice of the insertion layer is made to cause the in-plane effective magnetic field to be in the direction more or less opposite to the in-plane coercive field of the second magnetic layer. In some implementations, the insertion layer has a thickness of less than approximately one atomic layer to four atomic layers. In some implementations, the insertion layer includes Hf, Y, Al, Zr, Ti, Mo or Nb. In some implementations, the SHE layer includes platinum (Pt), tantalum (Ta), or tungsten (W), or an alloy of Pt, Ta, or W, or a compound of Pt, Ta, or W. In some implementations, the SHE layer includes PtMn, PtCr, PtZr, PtTa, PtNb, or PtZr. In some implementations, the in-plane effective field has a strength dependent upon a strength of the spin current and an interface between the SHE layer and the second magnetic layer. In some implementations, the first magnetic layer includes a synthetic antiferromagnetic (SAF) structure. In some implementations, the first magnetic layer is pinned by an adjacent antiferromagnetic layer. In some implementations, the second magnetic layer has a micromagnetic non-uniformity reduced as compared to when there is no spin-polarized current injected into the ferromagnetic layer. In some implementations, the choice of the spin Hall effect material is made to cause the net sum of the current-generated Oersted magnetic field and the current-generated in-plane effective magnetic field that is due to the spin current and/or to interfacial spin-orbit effects to be oriented in opposition to the in-plane magnetic anisotropy field of the second magnetic layer. In some implementations, the choice of the insertion layer is made to cause the net sum of the current-generated Oersted magnetic field and the current-generated in-plane effective magnetic field that is due to the incident spin current and/or to interfacial spin-orbit effects to be oriented in opposition to the in-plane magnetic anisotropy field of the free magnetic layer. In some implementations, the second magnetic layer comprises conductor materials including Pt, Pd, Nb, Mo, Ru, Re, Os, Ir, Au, Tl, Pb, Hf, or Bi, an alloy or a compound thereof. In some implementations, the SHE layer has a curved shape.

In another aspect, a method is provided for switching a magnetization direction of a free magnetic layer of a magnetic tunneling junction (MTJ) structure coupled to a spin Hall effect (SHE) metal layer based on a spin transfer torque (STT) effect. This method includes coupling a SHE metal layer to a second magnetic layer having a changeable magnetization direction to allow a current to flow from the SHE metal layer to the second magnetic layer. The second magnetic layer is in a magnetic tunneling junction (MTJ) structure including a first magnetic layer having a fixed magnetization direction, the second magnetic layer and a non-magnetic junction layer between the first magnetic layer and the second magnetic layer. The method also includes applying a charge current into the SHE metal layer to generate a spin-polarized current that is perpendicular to the applied charge current based on a spin Hall effect in the SHE metal layer and to effectuate an in-plane magnetic field in the second magnetic layer to change the magnetization direction of the second magnetic layer based on a spin transfer torque (STT) effect within tens of nanosecond switching time. In one implementation, the method may also include applying a second current to follow through the MTJ structure to assist the change of the magnetization direction of the second magnetic layer based on a spin transfer torque (STT) effect, wherein the second current is below a threshold current amplitude and is insufficient to cause the change of the magnetization direction of the second magnetic layer alone without the applied charge current into the SHE metal layer.

The above and other aspects of the disclosed technology and examples of their implementations are described in greater detail in the drawings, the description and the claims.

BRIEF DESCRIPTION OF THE DRAWINGS

FIG. 3A is an illustration of an operation of a spin Hall effect metal layer for providing a spin-polarized current into a free magnetization layer of an MTJ device, wherein the flowing directions of the in-plane charge current Jc (or the electron current, Je, in the opposite direction) and out-of-plane spin-polarized current Js and the direction of the injected spin σ are shown. FIG. 3B is another illustration of an operation of a spin Hall effect metal layer for providing a spin-polarized current into a free magnetization layer of an MTJ device, wherein the flowing directions of the in-plane charge current Jc (or the electron current, Je, in the opposite direction) and out-of-plane spin-polarized current Js and the direction of the injected spin σ are shown.

FIG. 5a depicts an example 3-terminal device. FIG. 5b shows an example of an easy axis minor hysteresis loop. FIG. 5c shows another example of an easy axis minor hysteresis loop. FIGS. 5d shows an example of a simulated equilibrium configuration for the P state. FIGS. 5e shows an example of a simulated equilibrium configuration for the AP state.

FIG. 6a shows an example of a 3-terminal device. FIG. 6b shows a SEM (Scanning Electron Microscope) micrograph of the 3-terminal device in FIG. 6a. FIG. 6c shows examples of magnetic-field-driven hysteresis curves for devices with different aspect ratios.

FIG. 8a shows an example of a micromagnetic simulation. FIG. 8b shows another example of a micromagnetic simulation. FIG. 8c shows another example of a micromagnetic simulation. FIG. 8d shows another example of a micromagnetic simulation. FIG. 8e shows another example of a micromagnetic simulation. FIG. 8e shows yet another example of a micromagnetic simulation.

FIG. 11a shows an example of a moment per area of a free layer as a function of an externally applied magnetic field. FIG. 11b shows an example of dP/dH versus a scanned DC magnetic field. FIG. 11c depicts an example of a variation of a resonance field as a function of frequency. FIG. 11d shows an example of a half width at half maximum (HWHM) linewidth as a function of frequency.

FIG. 12a shows an example of AP-to-P switching probabilities for an LA device. FIG. 12b shows P-to-AP switching probabilities for an LA device. FIG. 12c shows AP-to-P switching probabilities for an MA device. FIG. 12d shows P-to-AP switching probabilities for an MA device. FIG. 12e shows AP-to-P switching probabilities for an HA device. FIG. 12f shows P-to-AP switching probabilities for an HA device.

FIG. 13a depicts an example of switching probability as a function of pulse duration AP-to-P switching. FIG. 13b depicts an example of switching probability as a function of pulse duration P-to-AP switching. FIG. 13c depicts an example of switching voltage as a function of 50% switching times. FIG. 13d depicts an example of a comparison of a Ta and Pt HA device with 5 ns write error rates as a function of normalized pulsed voltages.

FIGS. 15a to 15h show micromagnetic simulations of switching phase diagrams of a Pt-(thick ref) and Pt-(pinned ref) device with strong pinning. FIG. 15a shows an example of a Pt-(thick ref) device simulated without Hoe for AP-P. FIG. 15b shows Pt-(thick ref) devices simulated without Hoe for P-AP. FIG. 15c shows Pt-(thick ref) devices simulated with Hoe for AP-P. FIG. 15d shows Pt-(thick ref) devices simulated with Hoe for P-AP. FIG. 15e shows Pt-(thick ref) devices simulated with an artificially inverted Hoe for AP-P. FIG. 15f shows Pt-(thick ref) devices simulated with an artificially inverted Hoe for P-AP. FIG. 15g shows Pt-(pinned ref) device with a thinner 1.5 nm RL that is strongly pinned, simulated with Hoe for AP-P. FIG. 15h shows Pt-(pinned ref) device with a thinner 1.5 nm RL that is strongly pinned, simulated with Hoe for P-AP.

FIG. 16a depicts current density as a function of pulse duration for a Pt-(pinned ref) device with an exchange pinned RL. FIG. 16b depicts current density as a function of pulse duration for a Pt-SAF device with a SAF RL. FIGS. 16c depicts current density as a function of pulse duration for a Pt-(SAF+weak pinning) device with weak pinning strength. FIGS. 16d depicts current density as a function of pulse duration for a Pt-(SAF+strong pinning) device with strong pinning strength.

FIG. 18a illustrates an example of a simulation of macrospin dynamics at T=0 K. FIG. 18b illustrates an example of a simulation of macrospin dynamics at T=4 K.

FIG. 19a depicts reversal trajectory for unpinned Pt devices with and without the Oersted field. FIG. 19b depicts reversal trajectory for unpinned Pt devices without the Oersted field and with a reversed Oersted field. FIG. 19c depicts reversal trajectory for unpinned Ta devices with and without the Oersted field.

DETAILED DESCRIPTION

Figure 1:
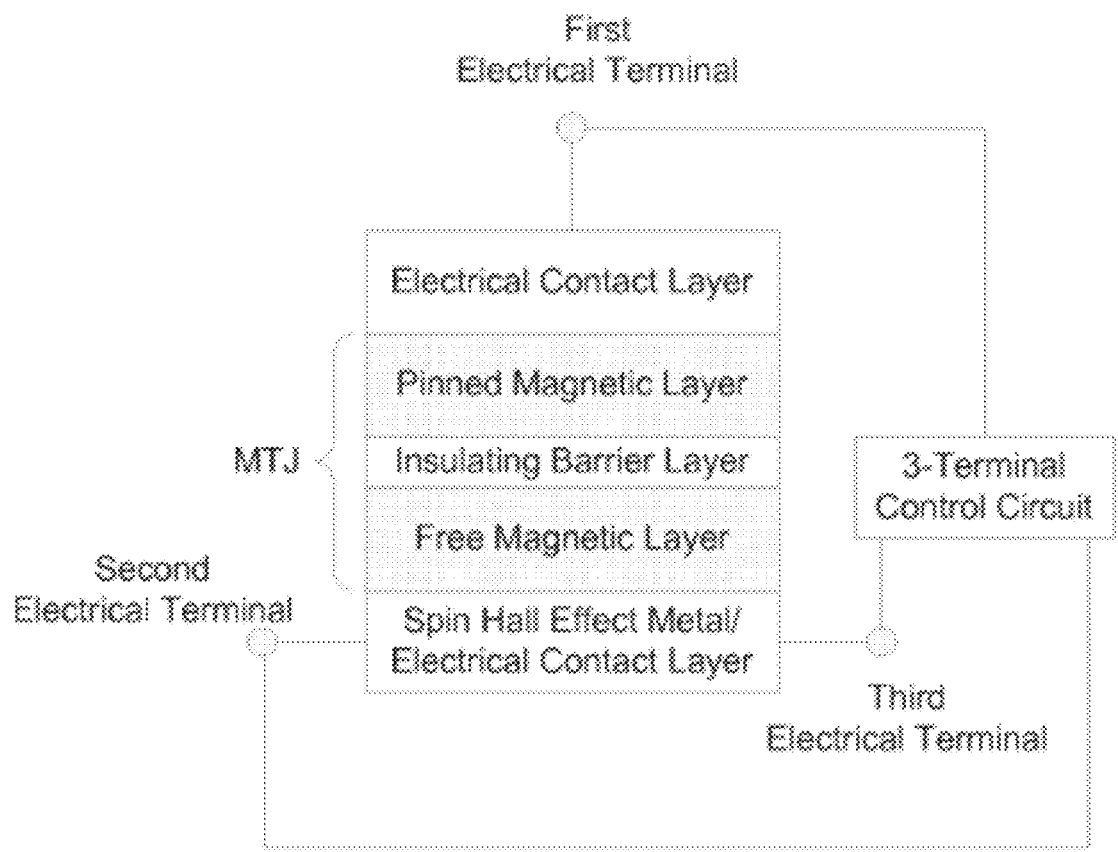
FIG. 1 shows an example of a magnetic tunnel junction (MTJ) device in a 3-terminal circuit configuration implementing a spin Hall effect metal layer for providing a spin-polarized current into the free magnetization layer of the MTJ device.

The techniques and devices disclosed in this document provide magnetic circuits and devices based on the spin-transfer torque (STT) effect in a multilayer magnetic structure having a free magnetic layer with a switchable magnetization by using a charge current in a spin Hall effect (SHE) metal layer coupled to the free magnetic layer to both inject spin-polarized electrons or charged particles into the free magnetic layer along a direction substantially perpendicular the free magnetic layer and to apply an Oersted magnetic field or a spin-orbit generated effective field produced by the same charge current to the free magnetic layer. The spin Hall effect metal layer can be located adjacent to the free magnetic layer or in direct contact with the magnetic free layer. The charge current is applied to the spin Hall effect metal layer via second and third electrical terminals at two different locations of the spin Hall effect metal layer to generate a spin-polarized current via a spin Hall effect to enter the magnetic free layer. The injected spin-polarized current and the Oersted magnetic field and/or the spin-orbit generated effective field produced by the same charge current in the magnetic free layer can cause or facilitate a change in the magnetization direction of the magnetic free layer based on the spin-transfer torque (STT) effect. A gate voltage can also be applied to the free magnetic layer across the multilayer magnetic structure to assist the change in the magnetization direction of the magnetic free layer.

Examples of 3-terminal devices based on the disclosed technology use the spin Hall effect in a material with strong spin orbit coupling to generate a current that flows perpendicular to an applied charge current, and to have this spin-polarized current be absorbed by an adjacent magnetic layer to apply a spin torque. This effect can be used to switch in-plane polarized magnetic layers through an anti-damping mechanism. This SHE-based STT is different from the STT process using a fixed or pinned ferromagnetic layer as a spin polarization layer to control the spin of an injected current passing through the fixed or pinned ferromagnetic layer and, notably, can have a higher transfer efficiency and produce stronger spin-transfer torque in the magnetic free layer. As such, a lower charge current can be used in the SHE-based STT design to achieve the same STT effect which requires a higher driving current in the STT process using a fixed or pinned ferromagnetic layer as a spin polarization layer. The efficiency or strength of the STT effect based on this combination of SHE and STT can be enhanced by an interface modification between the SHE metal layer and the magnetic free layer or by modifying or engineering the SHE metal layer by doping the SHE metal with certain impurities or other means. In addition, the same charge current in the SHE metal is along a direction parallel to the free magnetic layer and thus produces an Oersted magnetic field at the free magnetic layer with a substantially uniform field strength across the free magnetic layer assuming the magnitude of the charge current remains substantially constant at different locations in the SHE metal. The spin-orbit generated effective field is exerted at the interface of the free magnetic layer with a strength determined in part by the strength of the spin Hall effect in the SHE metal and the electronic nature of the interface. (See e.g. Ou, Y., Pai, C. F., Shi, S., Ralph, D. C., Buhrman, R. A., "Origin of fieldlike spin-orbit torques in heavy metal/ferromagnet/oxide thin film heterostructures," Physical Review B (94), 14, 2016.)

STT-MRAM devices using both in-plane and perpendicularly magnetized MTJs can be structured to provide non-volatile memory operations, essentially unlimited read and write endurance, low write energy, and low standby power. Historically, in-plane-magnetized (IPM) all-metal spin valves based on the giant magnetoresistance effect were the first to be studied, and were observed to be switchable with current pulses as short as a few hundred picoseconds. With the discovery of high tunneling magnetoresistance (TMR) with MgO tunnel barriers, magnetic tunnel junctions (MTJs) have become the primary focus of research and development, initially with magnetic layers having in-plane (IP)

magnetic anisotropy and then with perpendicularly magnetized (PM) devices. However, some attempted devices based on IP MTJs exhibited difficulty in achieving fast, reliable, and deterministic STT switching. Some attempted devices based on IP MTJs showed unacceptably high write error rates (WERs) in response to nanosecond-scale pulses, even as applied voltages approach the dielectric breakdown thresholds of the tunnel barrier. Currently, the fastest reliable ($<10^{-5}$ WER) switching times reported for 2-terminal STT-MRAM devices are 35 ns for in-plane MTJs, and 4 ns for perpendicular MTJs. See the article entitled "Perpendicular spin transfer torque magnetic random access memories with high spin torque efficiency and thermal stability for embedded applications" by Thomas, L. et al. in J. Appl. Phys. 115, 172615 (2014). Those and other experimental work and theoretical analyses on 2-terminal STT-MRAM devices may have led to skepticism about the possibility for significant improvements in switching speed and reliability of STT-MRAM devices, particularly for in-plane magnetized STT-MRAM devices because high-speed switching and low write error rates are important requirements in many practical applications for an emerging memory technology to compete with incumbent and more matured memory technologies.

This difficulty for STT-MRAM devices may be characterized in terms of "incubation delays" in both the thermally activated and the fast pulse switching regimes. This phenomenon has been variously ascribed to a bias-dependent field-like torque in MTJs, to current and voltage feedback fluctuations in the MTJs during the write process, or to undesirable higher-order spin wave excitations in the magnetic free layer (FL). The incubation delay in 2-terminal STT-switched IPM MTJs has motivated several alternate designs for short-pulse-switched MRAM. Such incubation delays were not generally observed in the fast anti-damping (AD) STT switching regime of IPM all-metal spin valves and this demonstrates that the pre-switching delay is neither an inherent feature of AD switching, nor is it purely related to the thermal activation. In the pursuit of high switching speeds, there have been more ambitious proposals for 2-terminal STT-switched IPM MTJs including orthogonal spin-transfer (OST) MRAM, where sub-ns switching has been demonstrated, but via a precessional non-deterministic mechanism that thus far has not allowed for competitive WERs. See, e.g., the article entitled "Ultrafast switching in magnetic tunnel junction based orthogonal spin transfer devices" by Liu, H. et al. in Appl. Phys. Lett. 97, 20-22 (2010).

The disclosed technology and the associated 3-terminal STT-MRAM devices in this document can be implemented in certain ways to achieve high switching speeds and improved reliability of three-terminal devices that utilize the spin-orbit torque from the spin-Hall effect (SHE) for efficient switching of an in-plane magnetized MTJ. The spin-Hall effect (SHE) provides an attractive alternate source of AD-STT for IPM devices. Tests conducted on sample 3-terminal devices based on the disclosed technology demonstrate that reliable switching operations with small write error rates (e.g., $\leq 10^{-5}$ WER) by using current pulses can be achieved in a short switching time around 2 ns. This demonstrated switching speed in some conducted tests is faster than previously reported switching speeds in spin-torque MRAM device—in-plane or perpendicular—and more than an order of magnitude faster than the limit expected for in-plane-magnetized MTJs in the macrospin approximation.

The conducted tests by using sample 3-terminal devices based on the disclosed technology suggest that the Oersted field generated by the charge current flowing in the SHE metal layer (e.g., a Pt/Hf SHE metal layer or channel) can assist the switching process that is driven by the spin Hall torque by the spin-polarized charge particles in the injected current that flows into the free magnetic layer from the SHE metal layer. Notably, the Oersted field generated by the charge current flowing in the SHE metal layer in the disclosed 3-terminal spin Hall devices is oriented differently than the orientation of an Oersted field by the current flowing perpendicularly through the free magnetic layer in 2-terminal STT-MRAM devices in which the Oersted field is circularly symmetric around the current flowing through the free magnetic layer of the MTJ. In the 3-terminal geometry, the Oersted field generated by the charge current flowing in the SHE metal layer is approximately uniform in space and lies in the plane of the free magnetic layer. In particular, the Oersted field generated by the charge current flowing in the SHE metal layer in the disclosed 3-terminal spin Hall devices has no corresponding counterpart in 2-terminal STT-MRAM devices. The materials and structures of disclosed 3-terminal devices with the SHE metal layer can be configured to leverage the combined effects of the injection of spin-polarized electrons or charged particles and the in-plane Oersted field in the free magnetic layer caused by the charge current in the spin Hall effect metal layer and the application of a gate voltage to the free magnetic layer across the multilayer magnetic structure.

The effect of the impinging spin current and/or that portion of the charge current that flows longitudinally along at the interface of the spin Hall metal layer with the magnetic layer will also result, due to spin-orbit electronic interactions at the interface, in a separate in-plane effective magnetic field being exerted on the switchable free magnetic layer. The orientation of this "spin-orbit generated effective magnetic field" is more or less collinear with that of the Oersted magnetic field, but can be either mainly parallel or mainly anti-parallel to this Oersted magnetic field. The sign and the amplitude of this spin-orbit generated effective field relative to that of the Oersted magnetic field depends on the choice of material for the spin Hall effect metal layer, that of the free switchable magnetic layer, and the choice of any thin interfacial material that is inserted between the spin Hall metal and the magnetic layer.

Specific implementations and examples of the disclosed technology are described below to illustrate features of the disclosed technology and its applications. Certain technical features and details are disclosed in the following Cornell University's patent documents which are incorporated by reference as part of the disclosure of this patent document:

U.S. Pat. No. 9,577,653 entitled "Quasi-Linear Spin Torque Nano-Oscillators" (previously published as PCT Publication No. WO2014/110603 on Jul. 17, 2014);

U.S. Pat. No. 9,230,626 entitled "Electrically Gated Three-Terminal Circuits and Devices Based on Spin Hall Torque Effects in Magnetic Nanostructures Apparatus, Methods and Applications" (previously published as PCT Publication No. WO2014/025838 on Feb. 13, 2014);

PCT Publication No. WO 2015/102739 entitled "Circuits and Devices Based on Spin Hall Effect to Apply a Spin Transfer Torque with a Component Perpendicular to the Plane of Magnetic Layers" (which entered U.S. national stage as U.S. application Ser. No. 15/030,291 and was published as U.S. Publication Number U.S. 2016-0276006 A1);

U.S. Pat. No. 9,105,832 entitled "Spin Hall Effect Magnetic Apparatus, Method and Applications" (previously published as PCT Publication No. WO2013/025994 on Feb. 21, 2013); and PCT Publication No. WO 2016/011435 entitled "Circuits and Devices Based on Enhanced Spin Hall Effect for Efficient Spin Transfer Torque."

FIG. 1 shows an example of a 3-terminal MTJ device having a spin Hall effect (SHE) metal layer coupled to the free magnetic layer of the MTJ junction. The layers in the MTJ and the SHE metal layer, e.g., selection of the materials and dimensions, are configured to provide a desired interfacial electronic coupling between the free magnetic layer and the SHE metal layer to generate a large flow of spin-polarized electrons or charged particles in the SHE metal layer under a given charge current injected into the SHE metal layer and to provide efficient injection of the generated spin-polarized electrons or charged particles into the free magnetic layer of the MTJ. Each of the free magnetic layer or the pinned magnetic layer can be a single layer of a suitable magnetic material or a composite layer with two or more layers of different materials. The free magnetic layer and the pinned magnetic layer can be electrically conducting while the barrier layer between them is electrically insulating and sufficiently thin to allow for electrons to pass through via tunneling. The spin Hall effect metal layer can be adjacent to the free magnetic layer or in direct contact with the free magnetic layer to allow the spin-polarized current generated via a spin Hall effect under the charge current to enter the free magnetic layer.

The 3 terminals in the MTJ device in FIG. 1 can be used to implement two separate control circuits that are not possible in the 2-terminal MTJ device in FIG. 1. As illustrated, the first control circuit is electrically coupled to two sides of the MTJ junction to apply a current or a gate voltage across the MTJ junction with the first terminal. Most 2-terminal MTJ devices have control circuits that appear similar to this first control circuit in FIG. 1 but the control circuits in those 2-terminal MTJ devices are quite different in their operations from the first control circuit in FIG. 1. In read operations, this first control circuit in FIG. 1 applies a read current to flow through the MTJ junction to allow the measurement or sensing of the resistance across the MTJ junction in determining whether the MTJ junction is in the high or low resistance state. The first control circuit sets the current amplitude of this read current below a threshold current level for switching of the free magnetization layer in the MTJ junction so that the magnetization direction of the free magnetization layer is not altered by this read current. Most 2-terminal MTJ devices also entirely rely on a high switching current across the MTJ junction at or above the threshold current level for switching of the free magnetization layer in a write operation to write a new data bit into the MTJ junction. As further explained below, when the 3-terminal devices based on the SHE metal layer performs a write operation, a charge current is directed through the SHE metal layer to assist the switching operation without operating the first control circuit to supply such a high current at or above the threshold current level for switching of the free magnetization layer. As shown in FIG. 1, this 3-terminal device uses a second, control circuit coupled to second and third electrical terminals at two contact locations of the SHE metal layer on two opposite sides of the area in contact with the MTJ structure above the SHE metal layer. This second control circuit is operated to supply the charge current in the SHE metal layer. The presence of this charge current produces spin-polarized electrons or charged particles based on the spin Hall effect in the SHE metal layer and the produced spin-polarized electrons or charged particles move in a direction perpendicular to the charge current into the MTJ junction as an injected spin-polarized current. Once entering the free magnetization layer, the spin-polarized electrons or charged particles in the injected spin-polarized current interact with the free magnetization layer and the spin torque carried by the spin-polarized electrons or charged particles is transferred to the free magnetization layer in the MTJ junction and, if the amplitude of the charge current in the SHE metal layer and the efficiency of the Hall effect in the SHE metal layer can collectively cause the amplitude of the injected spin-polarized current to be at or above the threshold current level for switching of the free magnetization layer in the MTJ the magnetization direction of the free magnetization layer can be switched to align with the spin of the spin-polarized electrons or charged particles of the injected spin-polarized current. Depending on the direction of the charge current in the SHE metal layer as controlled by the second control circuit, the spin of the spin-polarized electrons or charged particles of the injected spin-polarized current can be in two opposition spin directions for switching the magnetization direction of the free magnetization layer in two opposite directions that correspond to two different resistance states. Under this condition, the second control circuit functions as the write control circuit while the first control circuit functions as a read sensing circuit.

Although in principle either one of the first control circuit coupled across the MTJ junction and the second control circuit coupled to two terminals on the SHE metal layer can be configured to allow either one of the current across the MTJ or the charge current in the SHE metal layer to cause switching of the magnetization of the free magnetic layer, the use of the second control circuit coupled to two terminals on the SHE metal layer for switching can be advantageous in achieving short switching times that are difficult for 2-terminal devices relying solely on a switching current flowing through the MTJ junction. In this disclosed technology, the material properties of the SHE metal layer and the operation of the second control circuit can be used to produce both, the spin torque transfer of the spin-polarized electrons or charged particles of the injected spin-polarized current across the MTJ junction and an extra Oersted magnetic field in a oriented in the plane of the free magnetization layer. Collective operation of those two effects at the free magnetization layer contributes to the fast switching speeds in the disclosed 3-terminal devices in this patent document.

In some 3-terminal devices, the first control circuit can also be used to apply a gate control voltage across the MTJ junction so that the electric field at the free magnetic layer caused by the applied gate voltage can modify the magnetization of the free magnetic layer including its perpendicular magnetic anisotropy that significantly affects the threshold value of a spin-polarized current that can switch the magnetization of the free magnetic layer via spin torque transfer from a spin-polarized current that is injected into the free magnetic layer. In some implementations of the disclosed 3-terminal MTJ devices in this document, the first control circuit can be operated to control the gate voltage across the MTJ to be less than the threshold voltage that is sufficient to independently cause a significant current tunneling through the barrier layer of the MTJ to trigger the switching, and similarly, the second control circuit coupled to the SHE metal layer can be operated to control the charge current in the SHE metal layer to be less than the threshold charge current that is sufficient to independently cause a significant amount of the spin-polarized charges to enter the free layer to trigger the switching. In some implementations, the disclosed 3-terminal MTJ devices and techniques in this document may use both the first and second control circuits together in the combined operation of both the gate voltage across the MTJ and the injection of spin-polarized electrons or charged particles and the in-plane Oersted field and/or the in-plane spin-orbit generated effective field caused by having the charge current in the SHE metal layer to collectively trigger the switching in the free magnetic layer. In FIG. 1, a 3-terminal control circuit is coupled to the first, second and third electrical terminals to achieve the above desired control operations. In such implementations, the 3-terminal control circuit is operated as the following. The gate voltage is applied between a first electrical terminal in contact with the pinned magnetic layer and the spin Hall effect metal layer to modify the perpendicular magnetic anisotropy of the free magnetic layer, without allowing the gate voltage alone to cause switching of the magnetization direction of the free magnetic layer; and the charge current is applied between two electrical terminals in the spin Hall effect metal layer to induce a spin-polarized current and an associated in-plane Oersted magnetic field into the free magnetic layer without switching of the magnetization of the free magnetic layer. The application of the gate voltage and the application of the charge current are synchronized in order to trigger the switch of the magnetization of the free magnetic layer.

Figure 2:
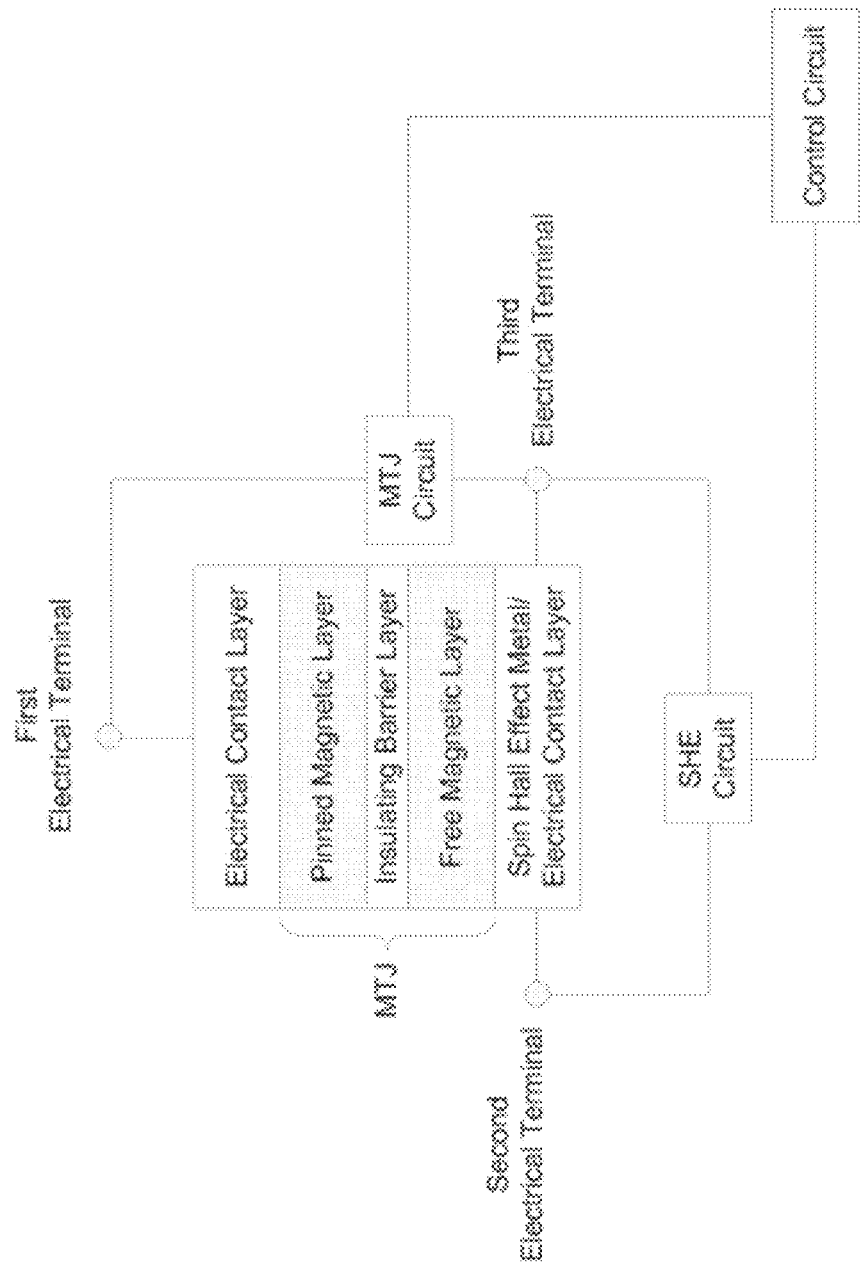
FIG. 2 shows another example of a magnetic tunnel junction (MTJ) device in a 3-terminal circuit configuration implementing a spin Hall effect metal layer for providing a spin-polarized current into the free magnetization layer of the MTJ device.

FIG. 2 shows an example where the 3-terminal control circuit in FIG. 2 is implemented by a MTJ circuit and a SHE circuit. The MTJ circuit is coupled between the first and the third terminals to apply a desired voltage across the MTJ without switching the magnetization of the free magnetic layer. The SHE circuit is coupled between the second and the third electrical terminals to supply the charge current in the SHE metal layer. A control circuit is further coupled to the MTJ circuit and the SHE circuit to control the operations of the MTJ and the SHE circuits, e.g., controlling the voltage amplitude or direction across the MTJ the current amplitude or direction of the charge current in the SHE metal layer, and synchronizing the voltage and the charge current in time for switching the magnetization of the free magnetic layer.

The 3-terminal MTJ devices disclosed in FIGS. 1 and 2 and other parts of this document can be implemented to provide circuit configurations and operational features that are difficult to achieve in 2-terminal MTJ devices and to achieve certain advantages in applications. For example, the charge current applied to the spin Hall effect metal layer via two electrical terminals at two contact locations of the spin Hall effect metal layer is used to inject a spin-polarized current into the free magnetic layer of the MTJ for effectuating a spin torque transfer into the free magnetic layer eliminates the need to apply a large current across the MTJ for effectuating sufficient spin torque transfer into the free magnetic layer for switching the magnetization of the free magnetic layer as in the 2-terminal MTJ device. In addition, the in-plane Oersted magnetic field generated by the charge current in the SHE metal layer can further facilitate the switching operation. This can be advantageous because there are detrimental aspects to effecting the magnetic reorientation of the free magnetic layer (FL) with a current pulse that passes through the tunnel barrier layer for the memory cell application. For example, the high current pulse required to tunnel through the MTJ junction for the switching operation can result in degradation of the electrical integrity of the insulator barrier layer in the MTJ. In a 2-terminal MTJ device, the design of the FL can be made to reduce the required write current pulse amplitude for the switching operation. However, since the reading operation and the writing operation in this 2-terminal MTJ device are effectuated via the same two terminals of the MTJ the electrical bias required to provide a large enough signal for a fast read of the memory cell can produce a tunneling current through the MTJ that is lower but close to the designed threshold current for the switching operation of the MTJ. This condition can result in a "write-upon-read" error where the MTJ is inadvertently switched during a read operation due to electrical noise that momentarily adds a small amount of additional current to the read current. The rate of this "write-upon-read" error increases as the difference between the current tunneling through the MTJ during a read operation and the STT threshold current for switching the MTJ becomes smaller. As such, various 2-terminal MTJ devices face a conflict between the need to reduce the amplitude of the tunneling current for switching the MTJ and the need for fast read associated with using a sufficiently large read current to complete the measurement of the MTJ resistance for reading the stored bit in a short time. Different from the 2-terminal MTJ devices, the 3-terminal MTJ devices in this document are configured to provide two separate and independent controls over the voltage across the MTJ to eliminate the above dilemma in the 2-terminal MTJ devices and can achieve a low tunneling current across the MTJ during a write operation while still being able to achieve a fast reading operation without being subject to the "write-upon-read" error in the 2-terminal MTJ devices. To effectuate a switching in the 3-terminal MTJ devices disclosed in this document, the two separate controls are synchronized in order to switch the magnetization of the free magnetic layer.

For a large array of 3-terminal MTJ cells in various circuits, the column and row driving circuits for the array of 3-terminal MTJ cells can be designed to reduce the overall circuit size by sharing circuit elements. As described in greater detail in the examples below, a cross-point memory architecture can be implemented based on the gated spin Hall torque switching to provide sharing of transistor switches in the 3-terminal MTJ cells, thus improving the overall compactness of circuits using large arrays of 3-terminal MTJ cells.

In another aspect, the availability of three terminals as input/output ports for a 3-terminal MTJ device disclosed in this document can be used to implement various logic operations. In contrast, with only two terminals available, the 2-terminal MTJ devices tend to be difficult, or infeasible in some cases, in building circuits for various binary logic applications based on the spin-torque switching operations.

In yet another aspect, the 3-terminal MTJs in combination with spin transfer torque disclosed in this document can be configured to employ a magnetic configuration such that the free magnetic layer has only one stable magnetic state but can be excited into magnetic precession about this equilibrium state at microwave or RF frequencies by the anti-damping torque generated by a steady spin-polarized direct current that impinges on the free magnetic layer. The frequency of oscillation is determined by the total time-averaged effective magnetic field experienced by the free magnetic layer, and this can vary with the amplitude of the magnetic precession, which in turn depends on the amplitude of the bias current. The time varying magnetoresistance of the MTJ due to the precession of the free magnetic layer provides a microwave output signal. Thus spin transfer torque can be employed in a MTJ to produce a spin-torque nano-oscillator (STNO) that has potential application in on-chip communication and signal processing applications.

In STNO devices based on 2-terminal MTJ devices, the amplitude of the oscillator cannot be electrically varied independently of its frequency, due to the 2-terminal character of the MJT.

Specific implementations and examples of the present 3-terminal MTJ devices and applications are provided below.

Figure 4:
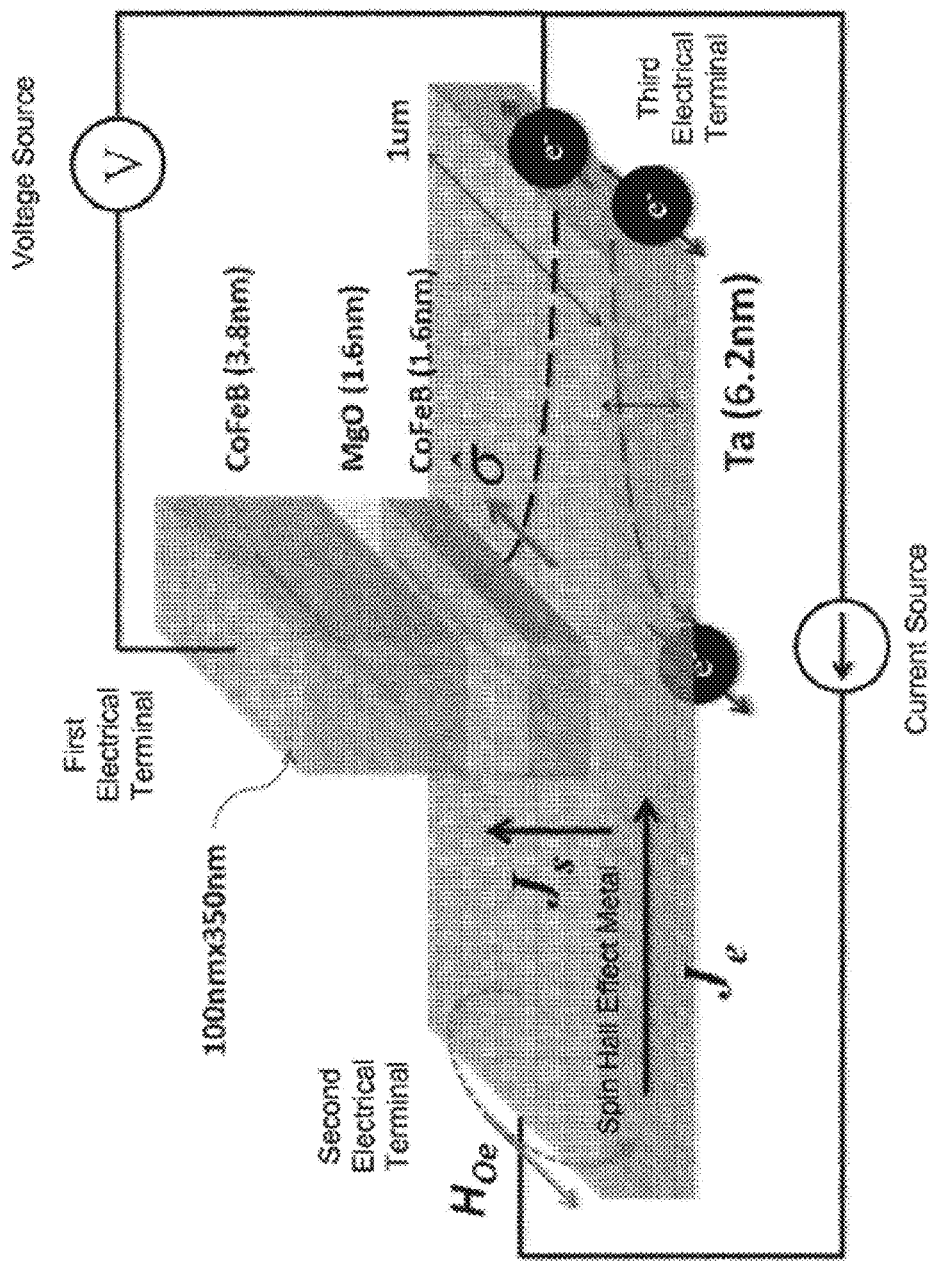
FIG. 4 shows an example of a three-terminal MTJ device having a current source coupled to a spin Hall effect metal layer and a voltage source coupled across the MTJ device.

The giant spin Hall effect in various heavy (high atomic number) metals, such as Pt, Ta, W, or Hf, an alloy thereof, or a compound thereof including PtMn, PtCr, PtZr, PtTa, PtNb, or PtZr, provides the foundation for the new 3-terminal MTJ devices in this document. The spin Hall effect in certain metals with large atomic numbers is illustrated in FIGS. 3A and 3B. FIG. 3A shows a spin Hall effect metal layer is in direct contact with a free magnetic layer of an MTJ for receiving an in-plane charge current $J_c$ (or $J_e$) and for producing a spin-polarized current $J_s$ into the free magnetization layer. The flowing directions of the in-plane charge current $J_c$ (or $J_e$) and out-of-plane spin-polarized current $J_s$ and the direction of the injected spin are shown. FIG. 3B further illustrates that the spin Hall effect separates two spin states in the charge current in opposite directions that are perpendicular to the in-plane charge current $J_c$ (or $J_e$). Hence, by controlling the current direction of the in-plane charge current $J_c$ (or $J_e$) in the SHE metal layer, one of the two spin states can be selected as the spin-polarized current $J_s$ that is injected into the free magnetization layer. As illustrated in FIGS. 4 and 5, the in-plane charge current $J_c$ (or $J_e$) in the SHE metal layer also generates an in-plane Oersted magnetic field $H_{Oe}$ in the free magnetization layer.

FIG. 3B further shows that, the orientation of the injected spins in the spin-polarized current $J_s$ is determined by a relationship between the charge current $J_c$ (or $J_e$), the direction of the injected spin moments $\vec{\sigma}$ (not the angular momenta) and the charge current $J_c$: $\vec{J_s} \propto \theta_{SH} \vec{\sigma} \times \vec{J_c}$, where $\theta_{SH}$ is the spin Hall angle and is a parameter specific to each material and quantifies the magnitude of the SHE effect in each material.

In the spin Hall effect, an electrical current flowing through a heavy metal thin film layer creates a transverse spin current due to spin dependent deflection of electrons in the directions perpendicular to the direction of current flow. Electrons of opposite spin angular momentum are deflected in opposite directions as illustrated in FIGS. 3A and 3B. In layers of high resistivity beta-Ta, for example, the spin Hall effect is particularly strong with the transverse spin current density being as high as 0.15 of the longitudinal electrical current density. This spin current can be utilized to exert torque on the magnetization of an adjacent magnetic film, and thus enables a 3-terminal magnetic circuit or device for reversing the magnetic orientation of the FL of a magnetic tunnel junction that is formed on top of a spin Hall layer, as also illustrated in FIGS. 2A and 2B.

FIG. 4 shows an example of a 3-terminal MTJ circuit that includes a voltage source coupled between the first and third electrical terminals across the MTJ and a current source coupled between the second and third electrical terminals to the spin Hall effect metal layer. The FL and PL layers in this example are shown to be parallel to the planes of the layers as in-plane magnetization that is perpendicular to the direction of the in-plane charge current $J_c$ (or $J_e$) in the SHE metal layer.

The present 3-terminal MTJ devices operate to, in some implementations, effectuate switching of the magnetization in the free magnetic layer by simultaneously applying the gate voltage across the MTJ junction and the charge current in the SHE metal layer. This aspect of the 3-terminal MTJ devices is based on voltage-controlled magnetic anisotropy (VCMA), in which an electric field alters a ferromagnetic film's perpendicular anisotropy by changing the electronic structure at a ferromagnet/oxide interface. VCMA has been shown to enable strong tuning of the coercive magnetic field of the FL in a MTJ and direct toggle switching of the FL by voltage pulses applied across the MTJ. A significant aspect of VCMA is that it offers the potential of effecting the switching of a FL with little or no current flow through the MTJ which could lower the energy cost of the MRAM write operation by minimizing Ohmic loss.

Considering the example in FIG. 4, the in-plane charge current $J_e$ in the SHE metal layer is set to produce the spin-polarized $J_s$ that is perpendicular to the in-plane charge current $J_e$ in the SHE metal layer. When the SHE metal layer is sufficiently thin in the transverse direction, the spin-polarized $J_s$ is injected into the free magnetization layer without significantly losing the injected spin moments $\vec{\sigma}$ due to the spin relaxation caused by propagation of the electrons or charged particles. The magnitude of the in-plane charge current $J_e$ in the SHE metal layer is controlled to be sufficiently small so that the spin-polarized current $J_s$ that has entered the free magnetization layer is significantly smaller than the threshold current for the spin-polarized current to cause switching of the magnetization of the free magnetic layer. The gate voltage across the MTJ junction, however, is applied to alter the perpendicular anisotropy by changing the electronic structure at the ferromagnet/oxide interface due to the voltage-controlled magnetic anisotropy (VCMA) to lower the threshold current required for the spin-polarized current to cause switching of the magnetization of the free magnetic layer to a level that the spin-polarized current $J_s$ that has entered the free magnetization layer is at or above the newly reduced threshold current for switching the MTJ. Under this condition of simultaneous application of the charge current and the gate voltage, the magnetization of the free magnetic layer is switched. In addition, FIG. 4 illustrates the Oersted field ($H_{Oe}$) in the plane of the free magnetization layer by the charge current $J_c$ (or $J_e$) in the SHE metal layer. The effect of this Oersted field is further explained below.

FIG. 5 shows a schematic representation of an exemplary 3-terminal device geometry with directions of charge current $J_e$, spin current $J_s$, spin accumulation σ, and Oersted field $H_{Oe}$ indicated. FIG. 5 includes FIGS. 5a through 5e. The Hf insertion layer is only present in conjunction with the Ta/Pt/Hf channel. Although the Hf insertion layer is shown as an example, the insertion layer can include other materials. For example, the insertion layer may include Y, Al, Zr, Ti, Mo and Nb, and other layers that suppress intermixing with the magnetic material. In FIG. 5a where AD switching by the SHE utilizes a 3-terminal geometry, the transverse spin current arising from an applied IP (in-plane) current flowing in a heavy-metal channel can act to switch the magnetic FL (free layer) of a MTJ patterned atop the channel, and the TMR of the MTJ is used to read out the FL orientation. Charge current flows in the channel also produces an Oersted field ($H_{Oe}$), but for channel materials of practical interest (e.g., Pt, β-Ta, and β-W), torque from the SHE acting on the FL will dominate the switching dynamics and determine the sign of switching for a given current direction. FIGS. 5b and 5c show easy axis minor hysteresis loops of the FL for devices with a thick RL and an SAF RL, respectively. FIGS. 5d and 5e show simulated equilibrium configurations for the P state and the AP state, respectively, for the case of the thick RL. This three-terminal magnetic tunnel junction (3T-MTJ) device approach provides the opportunity for utilizing high amplitude short pulses to drive fast AD-STT reversal, as in spin-valve devices, while still incorporating a tunnel barrier with a high resistance area product (RA) to allow for fast readout.

The SHE-induced reversal of IPM 3T-MTJs can be established in the thermally activated regime. In addition, tests on such devices demonstrate that reliable switching of such devices can be achieved on the nanosecond timescale (e.g., <$10^{-5}$ write error rates with 2 ns pulses). The analysis of the nanosecond-timescale magnetization dynamics that influence this highly desirable performance is provided here. First, the robustness of fast switching behavior in 3T-MTJs with Pt and Ta spin Hall channels has been demonstrated. In some devices with an unexpected asymmetry, there exist substantial differences in the characteristic switching speeds between the antiparallel-to-parallel (AP→P) and the parallel-to-antiparallel (P→AP) switching polarities, and this feature has been explored in detail using micromagnetic simulations. This asymmetry stems from an interaction between the Oersted field $H_{Oe}$ generated by current flow in the spin Hall channel and the micromagnetic non-uniformity present in the initial state of the FL due to dipole coupling with the magnetic reference layer (RL).

Utilizing fast pulse measurements in a variety of material stacks and detailed micromagnetic simulations, this unexpectedly fast and reliable magnetic reversal is facilitated by the self-generated Oersted field, and the short-pulse energy efficiency can be substantially enhanced by spatial non-uniformity in the initial magnetization of the magnetic free layer. The sign of the Oersted field is essential for this enhancement. Through simulations, it has been demonstrated that this mechanism can be beneficial: the Oersted field substantially increases switching speeds while an artificially reversed Oersted field does not. This stands in marked contrast to the detrimental effects of field-like torque observed in STT-switched two-terminal MTJs. Finally, the comparison of the fast-switching performance of Pt-based 3T-MTJs with RLs fabricated with varying pinning strengths and dipole field compensations has been done, showing that very symmetric and fast AP→P and P→AP switching can be achieved with well-pinned synthetic antiferromagnetic (SAF) RLs.

Figure 5A:
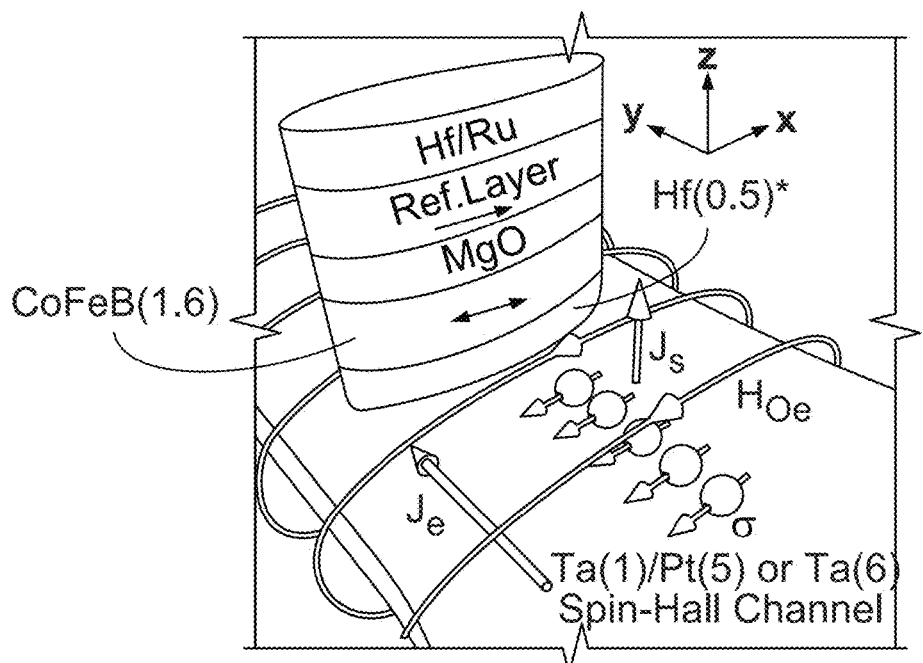
FIGS. 5a to 5e show schematic representations of easy axis minor hysteresis loops of a free layer, and simulated equilibrium configurations of a thick reference layer of an exemplary three-terminal MTJ device.
Figure 5B:
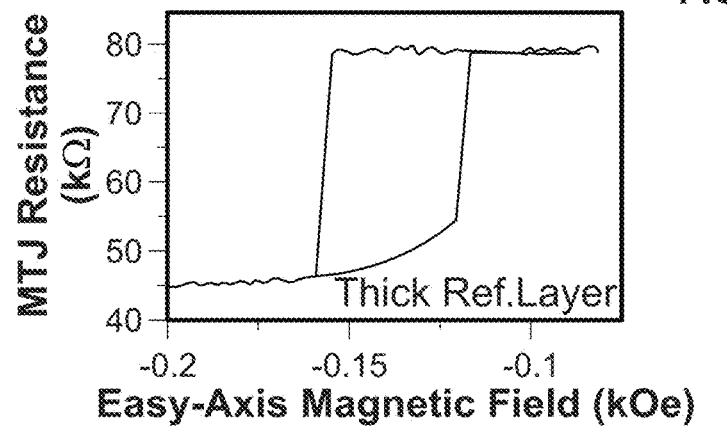
Figure 5C:
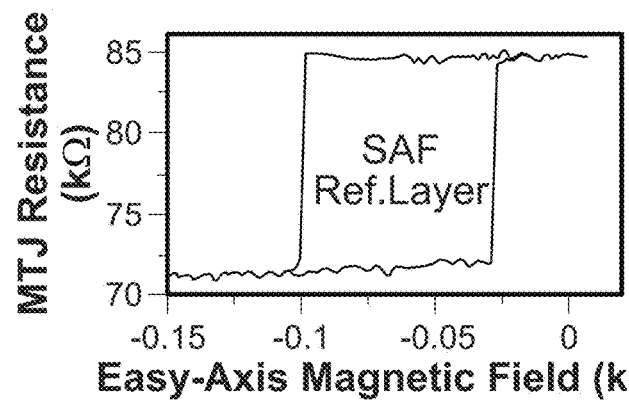
Figure 5D:
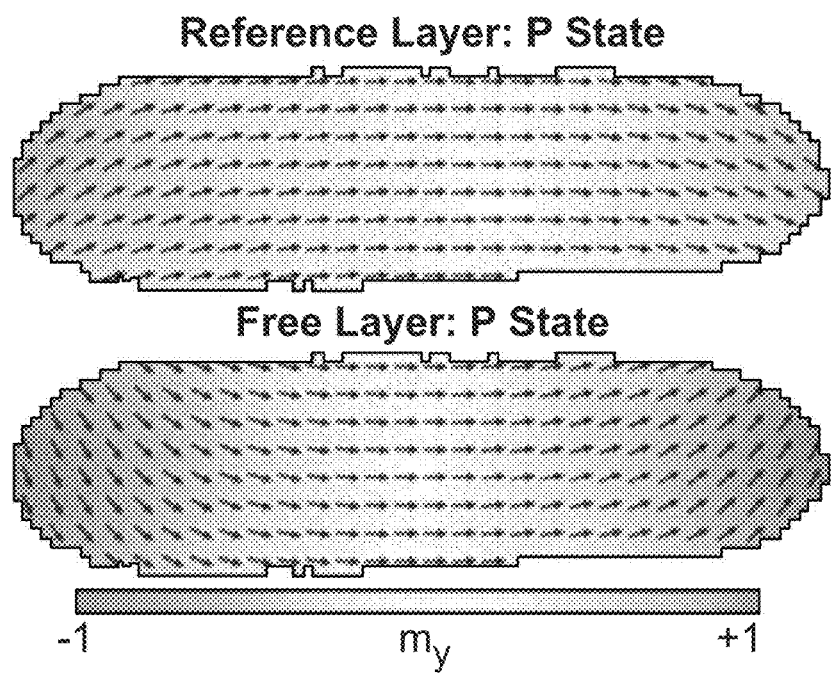
Figure 5E:
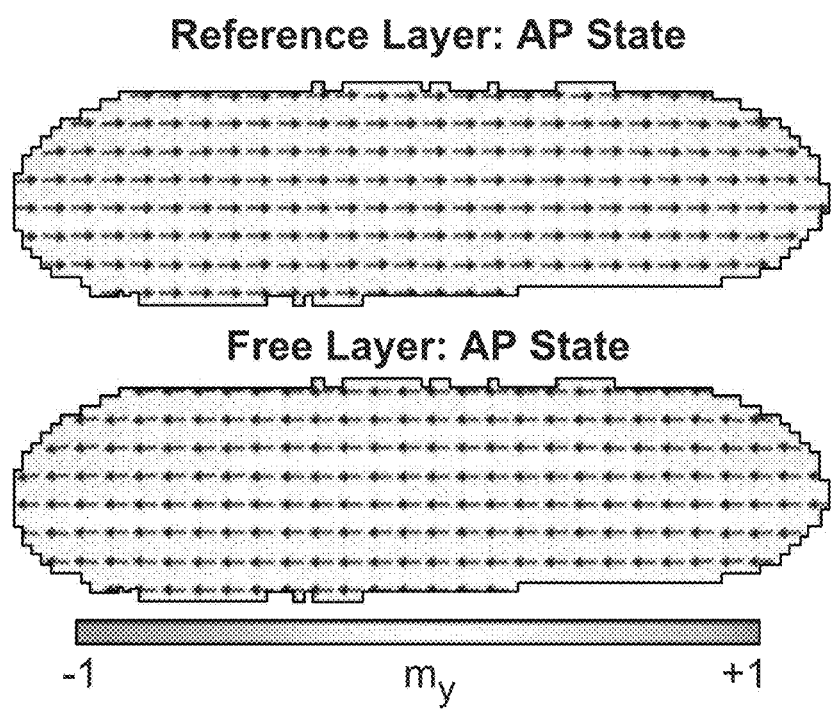

FIG. 5b shows the minor hysteresis loop of a Pt-based 3T-MTJ with a 4 nm thick FeCoB RL (hereafter referred to as a Pt-(thick ref) sample). The center of the loop is offset from zero field due to the stray field from the RL. The dipole interaction between the layers has additional important consequences. The rounding present in the P→AP switching branch is a manifestation of dipole-induced rotation away from a uniform parallel configuration, as captured in simulations results shown in FIG. 5d. Such rounding is greatly diminished in the AP→P branch of the hysteresis loop since the dipole interaction in this case reinforces a uniform AP magnetization state of the two layers (FIG. 5e). This micromagnetic non-uniformity can also be reduced by using a synthetic antiferromagnetic (SAF) structure to both rigidly pin the RL magnetization and minimize its stray dipole field. The minor hysteresis loop of a Pt-SAF device is indeed much more square as shown in FIG. 5c.

Figure 6A:
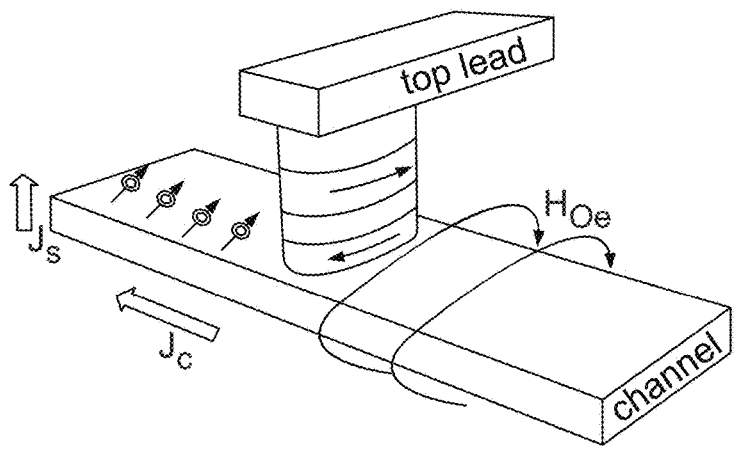
FIGS. 6a to 6c show schematic representations and magnetic properties of an exemplary three-terminal MTJ device.
Figure 6B:
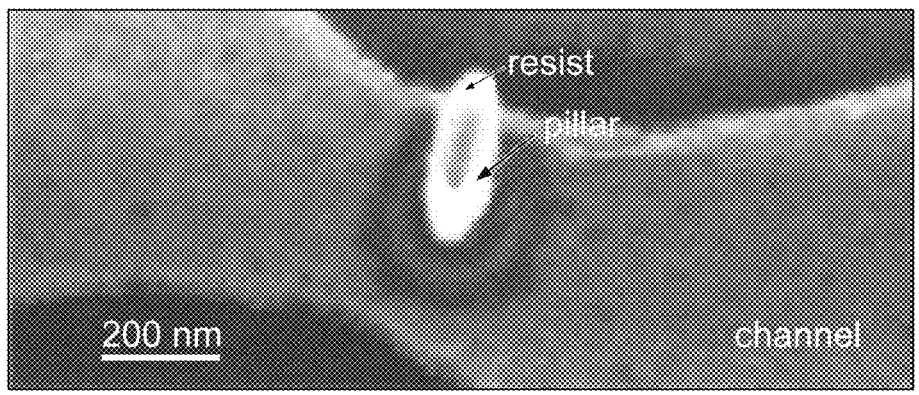

FIG. 6 shows tests conducted. FIG. 6a shows an exemplary 3-terminal device that was tested and FIG. 6b shows a SEM (Scanning Electron Microscope) micrograph of the 3-terminal device. In this tested device, 5-nm-thick Pt spin-Hall channel is used to generate a spin current that impinges on a $Fe_{60}Co_{20}B_{20}$ nanomagnet free layer that is part of a magnetic tunnel junction. The reference layer of the MTJ is a FeCoB/Ru/FeCoB synthetic antiferromagnetic (the full wafer stack is described in Methods). A 0.7 nm Hf spacer between the Pt and FeCoB free layer is used in order to reduce the magnetic damping, following Nguyen et al, Enhancement of the anti-damping spin torque efficacy of platinum by interface modification. *Appl. Phys. Lett.* 106, 222402 (2015). Data has been reported from three devices with different aspect ratios for the MTJ: a low aspect ratio ('LA', dimension 190×110 $nm^2$, aspect ratio 1:1.7, coercivity, $H_c$, 14 Oe), medium ('MA', 190×75 $nm^2$, 1:2.5, 30 Oe) and high ('HA', 190×45 $nm^2$, 1:4.2, 54 Oe). In the free layer of these MTJs, the aspect ratio determines the in-plane anisotropy and therefore the thermal stability factor, $\Delta$, which is the ratio of the energy barrier ($E_b$) for switching normalized by the thermal energy ($k_BT$). The MTJs are patterned by electron-beam lithography as rounded rectangular features on top of a 335 nm wide Pt/Hf channel, with a channel resistance for all devices of 1.05 k$\Omega$. The resistance-area product of the MTJ barrier is ~190 $\Omega$-$\mu m^2$. All the measurements reported were performed at room temperature.

Figure 6C:
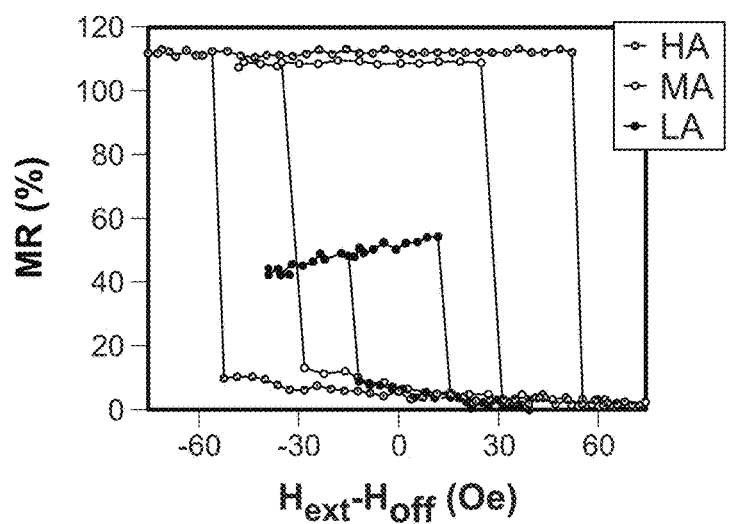

FIG. 6c shows magnetic-field-driven hysteresis curves for the devices with different aspect ratios. There is a residual dipole field ($H_{off}$=25, 62, 65 Oe for LA, MA and HA devices) due to slight imperfection in balancing the synthetic antiferromagnetic layer, that causes the centers of the hysteresis curves to be shifted from zero; the data in FIG. 6c are plotted relative to this offset. The parallel-state (P) MTJ resistances are 13.1 k$\Omega$, 14.3 k$\Omega$, and 21.7 k$\Omega$, whereas the anti-parallel (AP) state resistances are 19.9 k$\Omega$, 29.3 k$\Omega$ and 45.6 k$\Omega$ for the LA, MA and HA devices, respectively. Consequently the tunneling magnetoresistance (TMR) is ~110% for MA and HA devices, with a lower value (52%) for the LA device. The P-state resistance of the LA device is higher than expected based on the resistance-area product of the MA and HA devices. The reduced TMR of the LA device can be ascribed to a greater degree of spatial non-uniformity in its magnetic state, so that the P state resistance in the LA device are not fully saturated, due to a weaker shape anisotropy.

Figures 7A, 7B, 7C, 7D:
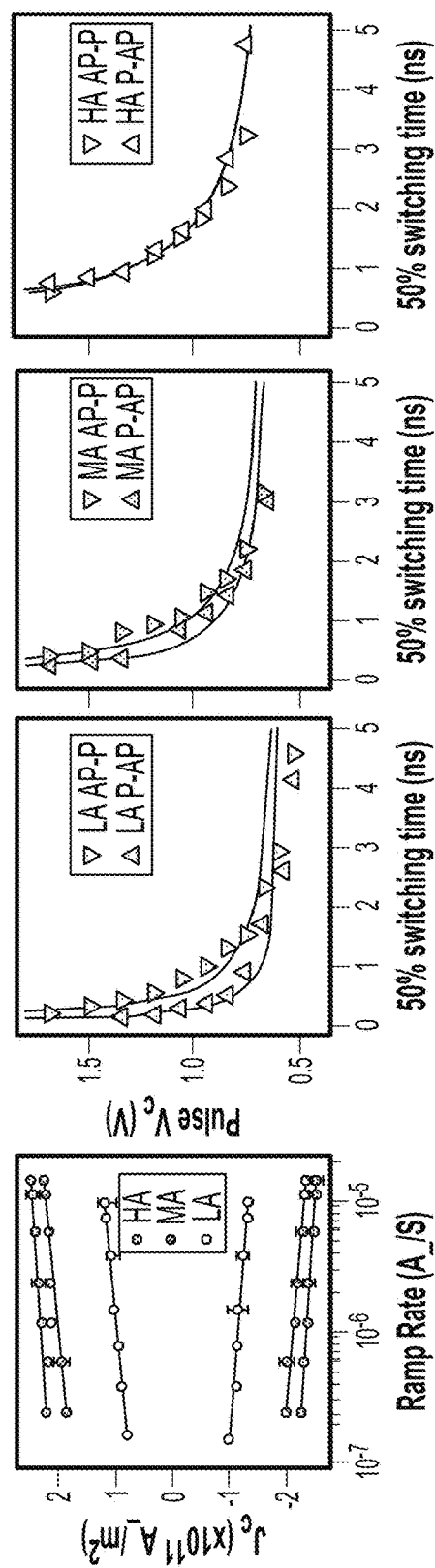
FIG. 7a shows dc switching current densities measured with a range of current ramp-rates for three MTJ devices with different aspect ratios.
FIG. 7b shows an example of a pulsed voltage amplitude required to achieve 50% probability of switching for a given pulse length data of dc switching current densities and pulsed voltage amplitudes that fit to values using the macrospin model relation.
FIG. 7c shows another example of pulsed voltage amplitude required to achieve 50% probability of switching.
FIG. 7d shows yet another example of pulsed voltage amplitude required to achieve 50% probability of switching.

In order to obtain quantitative measurements of the spin Hall effect in these devices, we first conduct dc switching experiments (FIG. 7a). These are performed using an external offset field bias ($H_{ext}$=$-H_{off}$) to center the hysteresis loops (as in FIG. 7c). The dependence of the critical switching current density on the ramping rate of the current density (j) is used to obtain the critical switching current density[25] in the absence of thermal fluctuations $J_{c0}$ and the thermal stability factor ($\Delta$=$E_b/k_BT$, at room temperature):

$$\langle J_c \rangle = J_{c0}\left(1 + \frac{1}{\Delta}\ln\left[\left|\frac{j}{J_{c0}}\right|\tau_0\Delta\right]\right) \qquad \text{Eq. 1}$$

where $\tau_0$ is the thermal fluctuation time, taken to be 1 ns. Table 1 summarizes the dc switching characteristics measured for the three devices. In Table 1, the dc switching parameters are averaged between AP-to-P and P-to-AP polarities, as these quantities are within experimental error. The pulse switching experiments reveal non-trivial asymmetries in AP-to-P and P-to-AP switching dynamics.

TABLE 1

|  | Device | LA | MA | HA |
|---|---|---|---|---|
| dc | $J_{c0}$ [×10$^{11}$ A/m$^2$] | 3.1 ± 0.3 | 4.4 ± 0.3 | 4.0 ± 0.3 |
|  | Δ | 36 ± 2 | 44 ± 3 | 54 ± 5 |
|  | $H_c$ [kA/m] | 1.11 | 2.44 | 4.30 |
| pulse | $V_{c0}$ (AP-P) [V] | 0.58 ± 0.05 | 0.62 ± 0.05 | 0.61 ± 0.05 |
|  | $t_{c0}$ (AP-P) [ns] | 0.43 ± 0.07 | 0.65 ± 0.09 | 1.00 ± 0.15 |
|  | $V_{c0}$ (P-AP) [V] | 0.59 ± 0.02 | 0.61 ± 0.04 | 0.59 ± 0.02 |
|  | $t_{c0}$ (P-AP) [ns] | 0.18 ± 0.02 | 0.56 ± 0.06 | 1.18 ± 0.07 |

To explore the device performance in the fast switching regime, switching probability was measured as a function of pulse voltage and pulse duration using a measurement method which will be described later. Interpolating from these measurements, the pulse durations were extracted, which result in 50% switching probability for each pulse voltage used. FIGS. 2a to 2d show the data and fit to these values using the macrospin model relation:

$$V(\tau) = V_{c0}\left(1 + \frac{t_{c0}}{\tau}\right) \quad \text{Eq. 2}$$

Here $V_{c0}$ is the critical pulse switching voltage and $t_{c0}$ is the critical pulse switching duration, both defined at the 50% switching probability point.

The voltage scales for switching, $V_{c0}$, are the same for the three aspect ratios within experimental error as shown in Table 1 below. This validates the understanding that the energetics of the switching are determined by the strength of the spin Hall effect and the geometry of the Pt channel in the pulse switching regime, both of which are the same for all three devices in this document. On the other hand, the dynamics of the switching shows surprising results, which vary in detail with the aspect ratio. First, the results indicate a remarkably fast timescale $t_{c0} \lesssim \sim 1$ ns considerably less than >>1 ns which is the typical switching time longer than the nanosecond time scale (e.g., one nanosecond or a few nanoseconds) expected from the anti-damping switching mechanism for an in-plane magnetized free layer in the rigid domain approximation. In addition, the values obtained for $t_{c0}$ show a clear dependence on the device aspect ratio with the low aspect ratio device having the fastest observed switching speed. Finally, there appears to be a growing asymmetry between the P-to-AP and AP-to-P polarity switching speeds as the aspect ratio is reduced.

To understand the origin of this unexpected but technologically important speed-up in the switching speeds, zero-temperature micromagnetic simulations of a representative device is performed to capture the behavior during switching. These indicate that the Oersted field generated by the current flowing in the Pt/Hf channel assists the switching process that is driven by the spin Hall torque. In the 3-terminal geometry, the Oersted field is approximately uniform and in-plane. The strength of the Oersted field (~1 kA/m at a current density of 4×10$^{11}$ A/m$^2$ in the Pt/Hf channel) can become comparable, and is opposite in direction, to the anisotropy field of the free layer (given the sign of the spin Hall effect in Pt). Notably, Oersted field has a large effect on the switching within a macrospin picture, because for anti-damping spin-torque switching the strength of the anisotropy field should have minimal impact on the critical current. The switching trajectory of the magnetization, at least within the context of a macrospin, rigid-domain approximation, should also remain largely unaffected by the magnitude of the anisotropy field. Conducted micromagnetic simulations show a striking difference in the switching mechanism depending on whether the Oersted field is turned on or off.

FIGS. 8a to 8f show micromagnetic simulations with and without Oersted field from the spin-Hall channel. In the absence of an Oersted field, the switching mechanism for both AP-to-P (a→b→d) and P-to-AP (d→f→a) are dominated by a highly non-uniform micromagnetic intermediate states. In contrast, switching in the presence of the Oersted field proceeds through near-uniform intermediate states. The time required to complete the switching process is also significantly shorter in the presence of the Oersted field, for both AP-to-P (a→c→d) and P-to-AP (d→e→a) polarities. The intermediate states are representative snapshots taken near the halfway time (t1/2) of the respective switching simulation. A similar distinction is also observed in the P-to-AP switching without (d→f→a) and with (d→e→a) the Oersted field. Quantitatively, the simulations indicate that the switching is completed more than faster with the Oersted field, especially in the P-to-AP polarity in this particular simulation.

In addition, the switching is seen to start immediately upon the application of current (t=0 in the simulations), which suggests the lack of any extended buildup of precessional amplitude, or incubation time, especially since the simulations are performed at 0 K temperature. It is noted that the incubation time has remained a major technological limitation factor for high-speed switching of in-plane STT-MRAM devices. Based on these observations from the micromagnetic simulations, the fast switching is enabled by the combination of three factors: 1) The micromagnetic curvature of the free-layer magnetization that ensures a non-zero initial torque; 2) the suppression of higher order spin-wave modes in the magnetization by the Oersted field that would otherwise hinder the completion of the reversal; and 3) the avoidance of macrospin-type stagnation points due to the non-uniformities in the micromagnetic states during the switching process.

In addition to applying the limited-statistics pulse voltage and duration sweeps such as shown in FIG. 7, a much more rigorous test of switching reliability was conducted to demonstrate feasibility for technological applications. The reliability of 3-terminal spin Hall devices has been tested by measuring WER statistics during up to 10$^5$ switching attempts for each pulse duration and pulse voltage of interest.

Figure 9A:
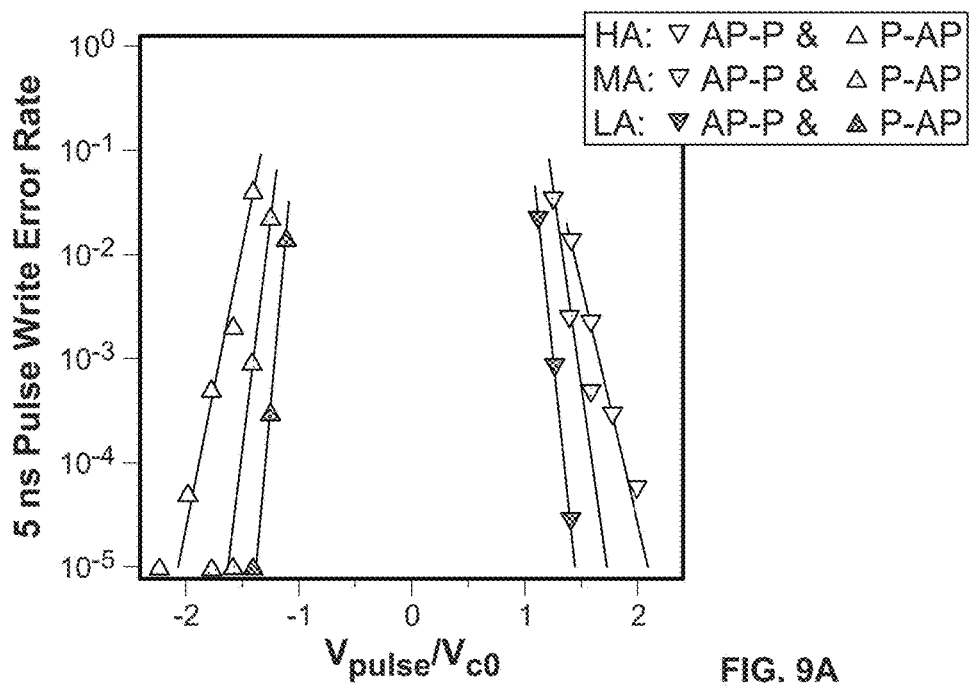
FIG. 9a shows an example of a write error rate for 5 ns pulses.
Figure 9B:
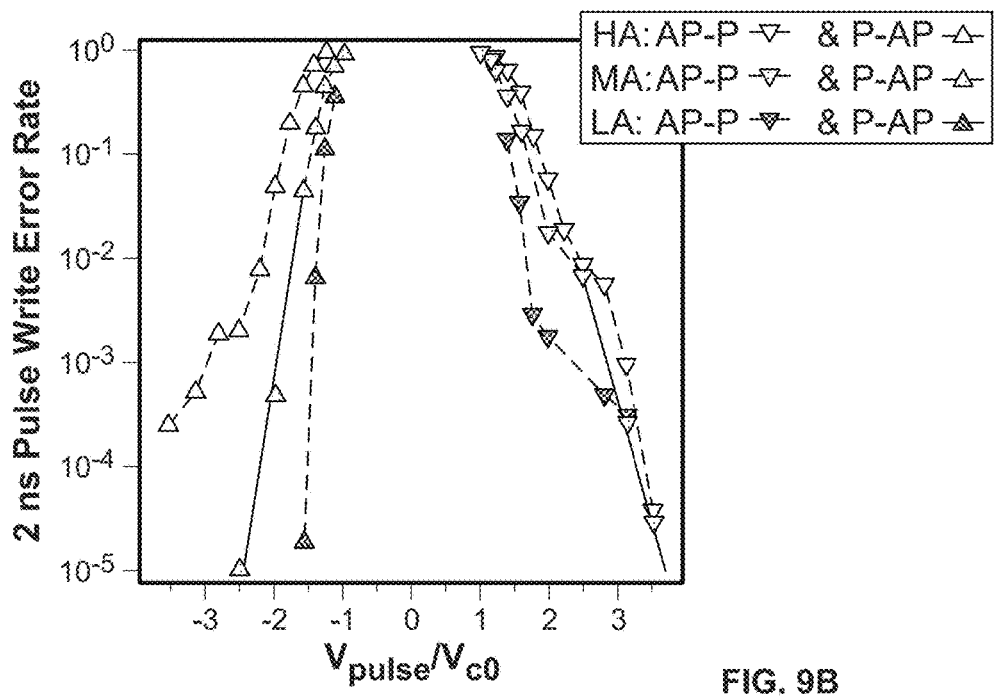
FIG. 9b shows another example of a write error rate for 2 ns pulses.

FIGS. 9a and 9b show the measured WERs with a 5 ns and 2 ns pulse durations, respectively, for the three devices. Both panels show WERs for the three devices with different aspect ratios as a function of normalized pulsed voltage. Open triangles represent data points where the measured error was zero. Dashed lines connecting the data points are provided as a visual guide. Solid lines are single-exponential fits that allow for estimation of the voltages needed to achieve error rates of 10$^{-5}$.

The results in FIGS. 9a and 9b show that, the WERs for 5 ns pulse durations demonstrate single-exponential scaling down to WERs of 10$^{-5}$ for all three devices, indicating that the micromagnetic switching trajectories are highly reliable and scale very favorably with the applied pulse voltage. In addition, the WER scaling trend in the results highlights a significant interplay between the Oersted field and the anisotropy field scale; while all three devices exhibit fast reliable switching, the lower the coercive field the greater the effect of the Oersted field in reliably speeding the reversal. Furthermore, the results in FIGS. 9a and 9b demonstrate that the WER with a 2 ns pulse can be driven below $10^{-5}$, most clearly in the MA device. Multi-exponential features have been observed at low WERs, especially for the HA and LA devices, for either P-to-AP and AP-to-P polarities, reminiscent of the 'low probability bifurcated switching' and back-hopping mechanisms discussed by Min et al, "A Study of Write Margin of Spin Torque Transfer Magnetic Random Access Memory Technology. IEEE Trans. Magn. 46, 2322-2327 (2010). However, the WER data presented here is for a pulse duration of 2 ns, which is an order of magnitude shorter than the 50 ns pulse durations that was explored by Min et al. Quantitatively, this 2 ns timescale precludes many of the explanations for the multi-exponential behavior based on macrospin-type switching mechanisms. Therefore, this behavior in the suggested devices stems instead from the rich micromagnetic switching mechanism at these previously unexplored speeds. Specifically, the multi-exponential features are likely due to a particular device's atomic-scale edge roughness, pinning, and any local non-uniformities of the free layer and can therefore can be further optimized for improved performance in the 2 ns regime.

This technologically attractive reversal mechanism may be referred to as "dynamic Oersted field assisted spin-Hall effect" (DOFA-SHE) switching. Based on the insight from the micromagnetic simulations, the fast and reliable switching as measured is a consequence of the in-plane Oersted field orientation present in the three-terminal geometry. As discussed above, although there is clearly a correlation of the degree of enhancement of the reversal speed with the coercivity of the device, the effect cannot simply be attributed to the Oersted field overcoming the coercive field. This conclusion gains further support from the fact that we also performed fast pulse switching experiments with a HA MTJ on a Ta spin-Hall channel that has a larger, but negative spin-Hall angle ($\approx-0.15$ vs.+0.08 for our Pt devices). This change in sign results in the Oersted field pointing along the anisotropy field during switching. Despite this change in direction we find that the Ta device also has sub-ns $t_{c0}$ for both AP-to-P and P-to-AP switching, with a similar scaling of the WER as the Pt HA device. It is emphasized that the Oersted field does not have a detrimental effect on the long timescale thermal stability of the devices because the field is only present during the pulse that drives switching. Accordingly, the Oersted field can be engineered to optimally assist the switching of nanomagnets of a desired thermal stability by optimizing the spin-Hall channel's geometry, resistivity, spin-Hall torque efficiency and spin diffusion length. Specifically, the channel geometry dictates the relation between the change current density and the magnetic field generated. This can be tuned by changing the channel from a rectangular shape to a curved shape where the current density varies spatially. The material properties (resistivity, spin Hall torque efficiency and spin diffusion length) of the spin Hall channel controls the amount of charge current needed to switch the free layer. These material properties can be tuned, for example, by alloying and controlling the surface roughness, to determine the amount of beneficial Oersted field produced when the pulsed current is applied.

In connection with the above disclosure, DOFA-SHE-switched in-plane-magnetized three-terminal MTJs has been established as an attractive architecture to achieve highly reliable magnetic switching for pulse times down to 2 ns or potentially shorter. This mechanism does not require an external magnetic field to make the switching deterministic, one of the difficulties facing the development of perpendicularly-magnetized MTJs switched using spin-orbit torques. The 3-terminal DOFA-SHE geometry also has additional advantages over conventional 2-terminal STT-MRAM in that the read and write current pathways are separate, so that the 3-terminal devices allow for arbitrarily high TMRs to minimize read times as well as to reduce read disturbs (since large currents do not flow through the MTJ itself). The beneficial speed-up of switching due to the Oersted field in the three-terminal geometry not only allows the SHE switching of in-plane MTJs to be faster than demonstrated for any other magnetic memory geometry, but it also opens up new avenues for optimizing device performance in terms of data retention versus write speed. In particular, our results suggest that the non-volatile nature of magnetic memories can now be fully harnessed for both long term data retention applications (requiring large $\Delta$), as well as for fast switching applications (requiring small $t_{c0}$) where data retention is not a primary concern. Finally, DOFA-SHE might prove attractive for cryogenic memory applications where the thermal stability of small (~1) aspect ratio MTJs is increased due to the low temperatures, thereby enhancing the relative role of the Oersted field from the spin-Hall channel.

The following sections provide information on materials and fabrications of devices, measurement methods, and simulations methods in the disclosed examples.

The magnetic multilayers are deposited onto thermally oxidized high-resistivity ($\rho>10,000$ $\Omega$cm) Si wafers using DC and RF magnetron sputtering by Canon ANELVA, Inc. The films include the following generalized set of layers:

||SiOx|spin Hall channel|free-layer|MgO|reference-layer-|capping-layer.

A systematic study of the effect of the dipole field and pinning of the reference layer on the switching dynamics of the free layer is performed by implementing three types of reference layers: "thick" reference layer which has pinning provided solely by its shape anisotropy; "Pinned" reference layer which uses the exchange bias from an adjacent IrMn antiferromagnetic layer; "SAF" reference layer which reduces the stray field; "SAF+Pinned" multilayer which provides both reduced stray field and pinning by IrMn exchange bias. Some devices presented in this patent document have the following stack structure (thicknesses in nm, $FeCoB=Fe_{60}Co_{20}B_{20}$, $CoFeB=Co_{60}Fe_{20}B_{20}$, $CoFe=Co_{70}Fe_{30}$):

Ta-(thick ref): ||SiOx|Ta (6)|FeCoB (1.8)|MgO (1.6)|FeCoB (3.5)|Ta (4)|Ru (4)

Pt-(thick-ref): ||SiOx|Ta (1)|Pt (5)|Hf (0.5)|FeCoB (1.6) |MgO (1.6)|FeCoB (4)|Hf (3)|Ru (4)

Pt-(pinned ref): ||SiOx|Ta (1)|Pt (5)|Hf (0.5)|FeCoB (1.6) |MgO (1.6)|FeCoB (2.4)|IrMn(10)|Hf (1)|Ru (4)

Pt-SAF: ||SiOx|Ta (1)|Pt (5)|Hf (0.5)|FeCoB (1.6)|MgO (1.6)|FeCoB (2.4)|Ru (1)|FeCoB (2.6)|Hf (3)|Ru (4)

Pt-(SAF+pinning) (both strongly and weakly pinned): ||SiOx|Ta (1)|Pt (5)|Hf (0.7)|FeCoB(1.4)|MgO (~1.6) |CoFeB (1.2)|Ta (0.2)|CoFeB (1.2)|CoFe (1)|Ru (0.85) |CoFe (2.5)|IrMn(7)|Ru (4)

For the case of the Pt channel, the 1 nm Ta under-layer was used to promote a smoother film, and to provide improved control over the magnetic anisotropy of the free layer of the MTJ; the Pt is sufficiently thick relative to its spin diffusion length (~2 nm)1 that the Ta does not contribute any significant spin Hall torque on the MTJ. The Hf insertion layer in the Pt devices is to minimize intermixing at the Pt/FeCoB interface, to reduce the magnetic damping and to improve spin-Hall torque efficiency $\xi$SH. The amorphous Hf layer by itself produces negligible spin-orbit torque.

Using Deep-UV photolithography and Ar+ ion milling, the stacks are patterned into 335 nm wide, 600 nm long channels. Using an aligned electron beam lithography exposure, elliptical MTJs of 60×210 nm² lateral extent is defined in the center of the channels. The pillars are patterned by ion milling, and the etch process is terminated when traces of the channel material become visible in the etch chamber's endpoint detector. After protecting the devices with evaporated SiO₂, electrical connections are established to the channel and top contact of the MTJ by means of a liftoff process. The devices are annealed at 300° C. for 30 minutes in a vacuum of 8×10⁻⁷ Torr, during which time the "pinned-ref" and "SAF+weak pinning" devices are subject to a 1.5 kG field along their long axes, while the "SAF+strong pinning" devices are instead subject to a 5.0 kG field. Thereafter, the thick-reference-layer devices possess a TMR≈80% and an RA≈400 Ωµm², while the pinned and SAF devices suffer from reduced TMRs of 20% and 30%, respectively. The residual dipole fields ($H_{dip}$) are shown in Table 2 which will appear later in this patent document. The reference layers in the "pinned-ref" devices are characterized by an exchange bias field $H_{ex}$=250 G and coercive field $H_c$≥100 G. The "SAF+weak pinning" and "SAF+strong pinning" devices were fabricated with optimized materials stacks from Canon Anelva Corp., and they have a TMR≈100% and RA≈250 Ωµm². The $H_{ex}$ in the "SAF+strong pinning" devices is ~2500 G. Further optimization of these reference layer structures will obviate the need for external fields during operation.

In some other implementations, devices may include the multilayers including (thicknesses in nm, FeCoB≡Fe₆₀Co₂₀B₂₀:
|SiOx|Ta(1)|Pt(5)|Hf(0.7)|FeCoB(1.6)|MgO|FeCoB(1.2)|Ta(0.2)|FeCoB(1.2)|FeCo(1)|Ru(0.85)|F eCo(2.5)|IrMn(7)|Ru(4), where the FeCoB(1.6) includes the magnetic free layer upon which the spin-Hall spin torque acts.

The rest of the FeCoB and FeCo layers act as a synthetic antiferromagnet and the IrMn layer provides pinning through exchange bias. The nominal Hf insertion layer thickness $t_{Hf}$=0.7 nm is chosen to reduce the damping of the free layer while maintaining the $\xi_{SH}$, as reported by Nguyen et al, Enhancement of the anti-damping spin torque efficacy of platinum by interface modification. *Appl. Phys. Lett.* 106, 222402 (2015). It is found from flip-chip ferromagnetic resonance measurements on the exchange-biased films, however, a Gilbert damping parameter α=0.018 and effective magnetization $M_{eff}$=3.29×10⁵ A/m which are quantitatively different from values in Nguyen et al., possibly due to differences in deposition and annealing conditions. The value for $M_s t_{FeCoB}^{eff}$, the product of saturation magnetization and effective thickness of the free layer, is measured to be 0.002 A from vibrating sample magnetometry. From this, spin-Hall efficiencies are calculated in the range $\xi_{SH}^{eff}$=0.052-0.073 for the three devices in this report, using the macrospin-derived relation $$2^4 \xi_{SH}^{eff} = \frac{2e}{\hbar} \mu_0 M_s t_{FeCoB}^{eff} \alpha \left( H_C + \frac{M_{eff}}{2} \right) / J_{c0}.$$

The multilayer stacks are patterned by deep-UV photolithography (ASML 300C) and etched by Ar+ ion milling (IntlVac) into 335 nm wide, 600 nm long channels. Using an aligned electron beam lithography (JEOL JBX-6300FS, 100 kV) exposure and ion milling, the MTJs is defined by fabricating elliptical pillars with three different aspect ratios, as detailed in the main text, in the center of the channels. The ion-milling process is terminated when traces of the channel material become visible in the chamber's secondary ion mass spectrometry endpoint detector. After protecting the devices with electron-beam evaporated SiO₂, electrical connections are established to the channel and top contact of the MTJ by means of a liftoff process. The devices are annealed at 360° C. for 45 minutes in a vacuum of <10⁻⁶ Torr, in the presence of a 1.5 kG external field along their long axes.

In conducted pulse switching experiments, two Picosecond Pulse Labs 10,070A pulse generators are routed through a voltage divider, the capacitive port of a bias-tee, and finally through microwave probes to the device leads. One of the pulse generators is used to apply rectangular switching pulses of varying amplitude V and duration τ (with 65 ps rise time and 100 ps fall time), while the other is used to apply shallow reset pulses at the 10 ns maximum pulse duration. As in the dc ramp-rate measurements, $H_{ext}$ is adjusted to bias the samples at the centers of their magnetic-field hysteresis loops. This field only cancels the average projection of the reference layer's dipole field along the x direction: according to our micromagnetic simulations, some curvature of the free layer magnetization remains in the P state though it is most exaggerated in the LA devices.

The initial and final MTJ resistance states are measured using a lock-in amplifier connected across a voltage divider formed by the MTJ and a 10 MΩ series reference resistor. The resistance of the MTJ (across the top lead and one half of the bottom channel) is measured by a lock-in amplifier connected across a voltage divider formed by the MTJ and a 10 MΩ reference resistor. For measurements of devices' fast pulse response, two Picosecond Pulse Labs 10,070 A pulse generators routed through a voltage combiner are employed, the capacitive port of a bias-tee, and finally through microwave probes to the device leads. One of the pulse generators is used to apply rectangular switching pulses of varying amplitude V and duration, while the other is used to apply shallow reset pulses at the 10 ns maximum pulse duration T (both pulses have 65 ps rise time and 100 ps fall time). Pulses delivered to the write channels are partially reflected given the impedance mismatch from our transmission lines, the current densities delivered to the channel are calculated in terms of the channel cross-sectional area A.

$$J = V_{corr}(1+\Gamma)/R_w A \quad \text{Eq. 3}$$

The reflection coefficient $\Gamma=(R_w-50\ \Omega)/(R_w+50\ \Omega)$, and the pulse voltage $V_{corr}$ that corrects V for losses in the circuit external to the device. For Ta|Pt|Hf channels the total write path resistance $R_w$ is typically 0.5-1.5 kΩ, depending on the amount of over-etching during the pillar definition process. The Ta devices have higher $R_w$=3.5 kΩ consistent with the higher Ta resistivity. These $R_w$ values include a 5r contribution from current spreading in our extended lead geometry in addition to the 2r contribution from the actual channel, where 2r is the ratio of the length of the channel to its width in this implementation of the device. Thus, in integrated devices lacking expansive leads, that is with high conductance contacts located very close to the channel ends, one expects to achieve write impedances closer to 200-300 Ω for Ta|Pt|Hf channels, substantially lower than can realistically be obtained in two-terminal MTJs of the same size. A lower ratio the length of the channel to its width can also be achieved by advanced lithographic processing, thereby further reducing the write impedance in further implementations.

Simulations are performed using the OOMMF micromagnetic simulation package. The switching response of MA samples is modeled, which are given a realistic edge profile (up to the in-plane spatial discretization length of 2.5 nm) taken from SEM images of the devices. Both the free and reference layers are included in the simulation, therefore incorporating their dipolar interactions, and round their thicknesses to the nearest multiple of the 1.5 nm vertical discretization length. From the equilibrium magnetic state, current pulses with 65 ps rise time are applied, including the Oersted field as a uniform magnetic field along the long axis of the sample. All simulations are performed at 0 K. Further details of the micromagnetic simulations and the impact of Oersted field on switching mechanism and asymmetry in AP-P and P-AP polarities will be published elsewhere. For the reference, movies depicting the simulated switching mechanism for both AP-P and P-AP polarities, with and without the Oersted field, for a current density of $2.1 \times 10^{12}$ A/m$^2$ are available online.

Using the devices, measurements methods, and simulations methods, which have been described above, observations have been made in relation to various characteristics of the disclosed technology. Additional information on the disclosed technology will be discussed in the following sections.

Micromagnetic Curvature in the Free Layer

Through simulations, the existence of micromagnetic curvature in both the AP and P states has been found, due to the influence of the reference layer's residual dipole field, as well as due to edge roughness. Although the AP state appears to have lower curvature than the P state—due to the fact that the dipole field from the reference layer reinforces the shape anisotropy in that case—local curvature can still be expected to exist in both the AP and P states as shown in FIGS. 9a and 9b. Since the anisotropy field is the lowest in the LA device, more curvature in the LA devices can also be expected. This was experimentally observed from the magnetoresistance measurement comparing the three devices, where both the AP and P state resistances in the LA device vary with applied magnetic field before and after the switching points. In contrast, the AP states in the MA and HA devices show more stable resistances beyond their respective switching fields.

Figure 10:
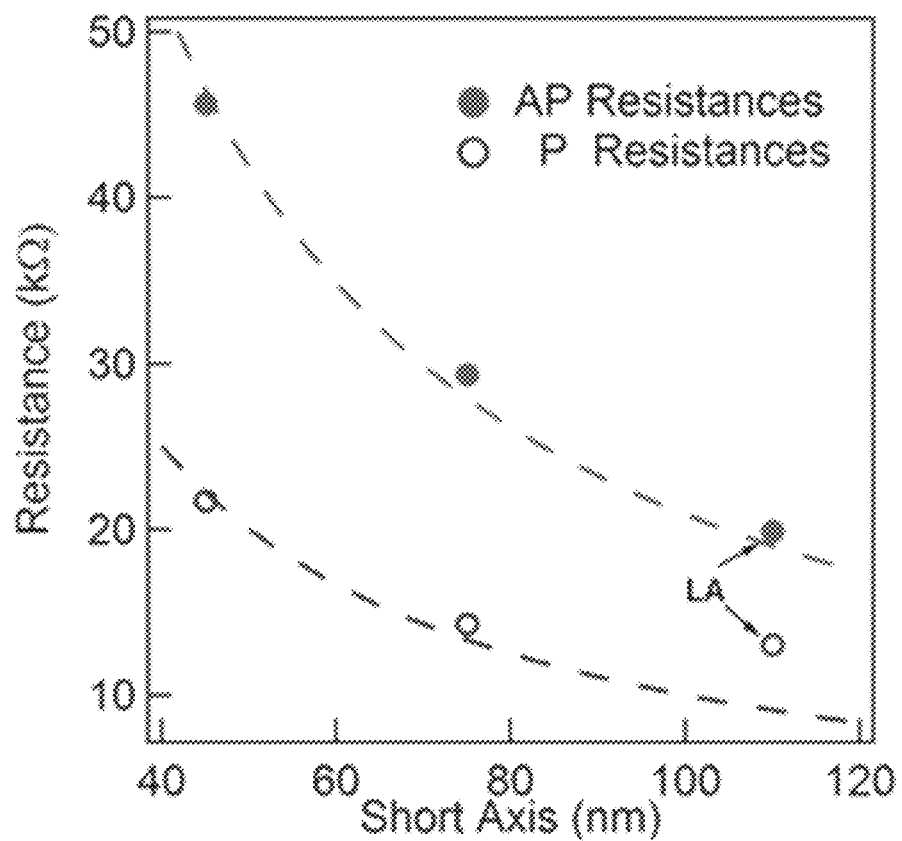
FIG. 10 shows resistance of an exemplary three-terminal MTJ device as a function of MTJ aspect ratio.

FIG. 10 shows resistance of an MTJ device as a function of MTJ aspect ratio. The P state resistance for the low aspect (LA) ratio device shows deviation from the expected trend based on the device short axis, indicating the existence of significant curvature in the magnetization state. Note that the long axis is kept constant at 190 nm for all three aspect ratios, so the smaller the aspect ratio the larger the area and smaller the resistance of the MTJ. FIG. 10 quantifies the raw AP and P state resistances for all three devices, with a 525 Ω contribution from the channel subtracted from the measured total MTJ resistance. Note that the spin-Hall channel contributes half of its total resistance to the measured MTJ resistance, as it forms the 'bottom lead' for the measurement circuit in the three-terminal configuration. The 'top lead' resistance is negligible as it includes ~50 nm Ti/Pt material. Using the MA and HA device AP and P state resistances as more consistent values for comparison, it is seen that the LA device's P state resistance is 13.1 kΩ (~43% higher than the expected 9.1 kΩ). The weak anisotropy in the LA free layer likely increases the curvature in the P state.

Magnetic Characterization of the Free Layer

Figure 11A:
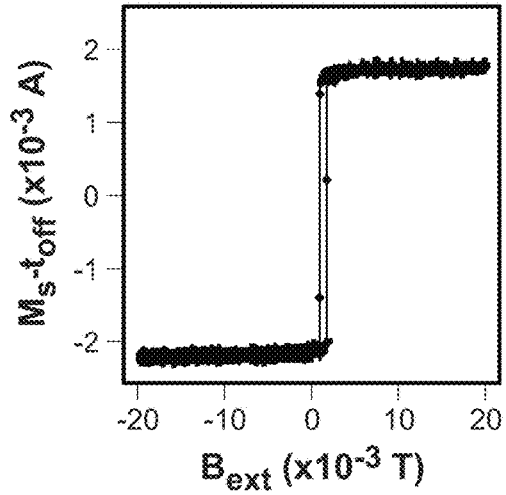
FIGS. 11a to 11d show FMR characterization of a free layer of an exemplary three-terminal MTJ device.
Figure 11B:
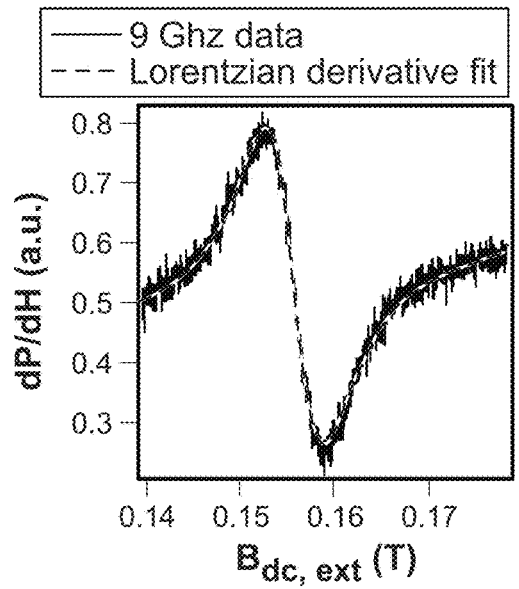
Figure 11C:
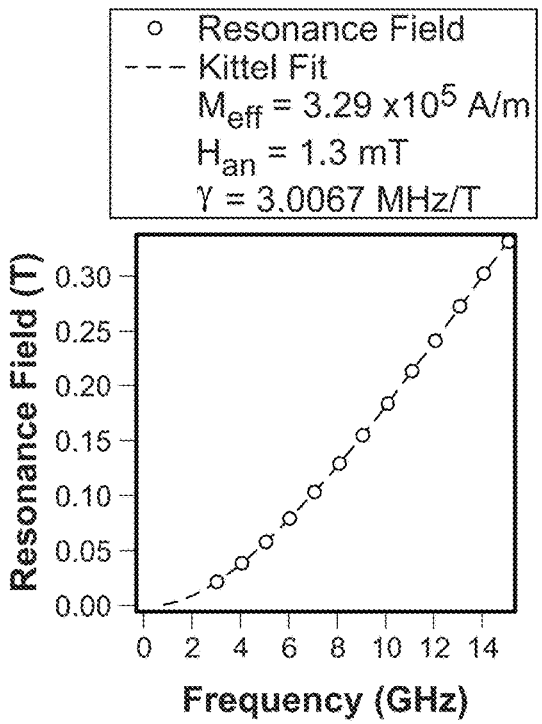
Figure 11D:
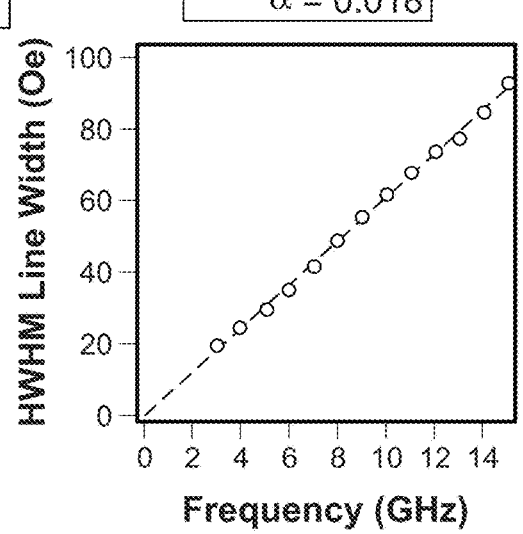

Vibrating sample magnetometry (Quantum Design Inc) is used to measure the magnetic moment of an unpatterned 5×5 mm die from the same wafer used for fabrication of the devices. FIG. 11a shows the moment per area of the free layer as a function of the externally applied magnetic field. The saturated value of $M_s \times t_{eff}$ is 0.0020 A. Using the as-deposited 1.6 nm thickness of FeCoB, it is possible to calculate the $M_s$ to be $1.25 \times 10^6$ A/m. This value does not account for any magnet dead layer at the Hf/FeCoB interface. FIG. 11b shows the raw data of dP/dH versus the scanned dc magnetic field. The Lorentzian derivative fit to this data at 9 GHz frequency is also overlaid, and shows very good fidelity to the data. FIG. 11c presents the variation of the fitted resonance field, as well as the Kittel model fit to this data from which the value for Meff is primarily obtained. FIG. 11d shows half width at half maximum (HWHM) linewidths as a function of the rf frequency, and the linear fit to these points gives us the magnetic damping of the free layer.

A flip-chip technique is used to measure the ferromagnetic resonance in an annealed, unpatterned die from the same wafer used to fabricate the devices. Briefly, a microwave waveguide optimized for transmission in the 1-20 GHz range carries a 15 dBm rf power generated by a signal generator (Agilent E8257). The sample is placed on top of this waveguide such that the magnetic layers face the waveguide. A dc magnetic field is scanned using an external electromagnet to detect the resonance condition. This dc field is further modified by using a small ac field generated by Helmholtz coils, which provides an ac signal for lock-in detection. When the resonance condition is satisfied, microwave power is absorbed into the uniform precession mode. The changes in the absorbed power (dP/dH) are detected using a rectifying diode, at the ac field modulation frequency.

Switching Probability Plots in the Pulsed Regime

Figure 12A:
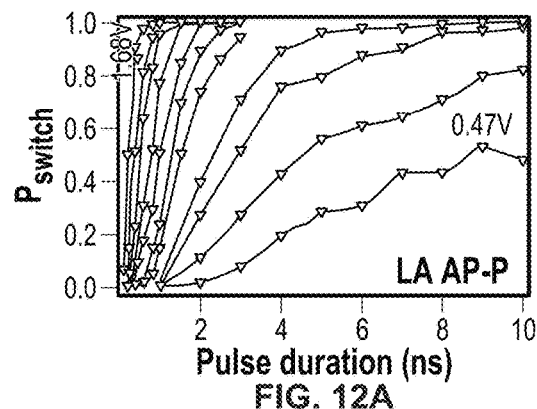
FIGS. 12a to 12f show examples of pulse voltages and pulse duration sweeps for various switching probabilities.
Figure 12B:
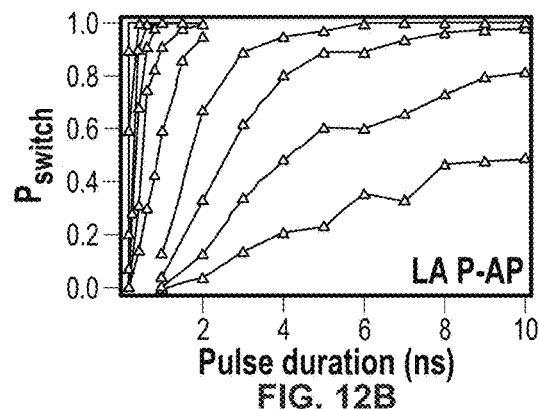
Figure 12C:
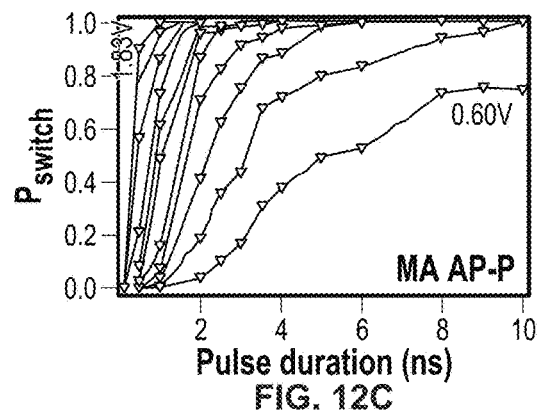
Figure 12D:
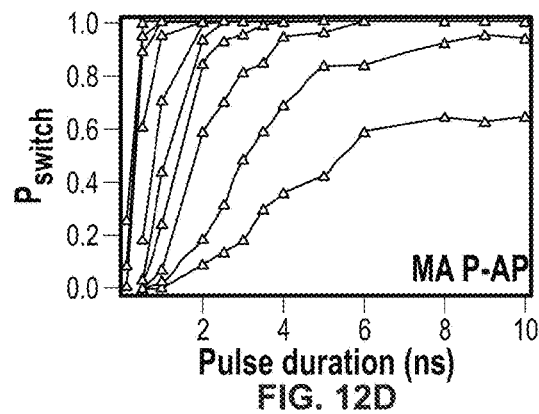
Figure 12E:
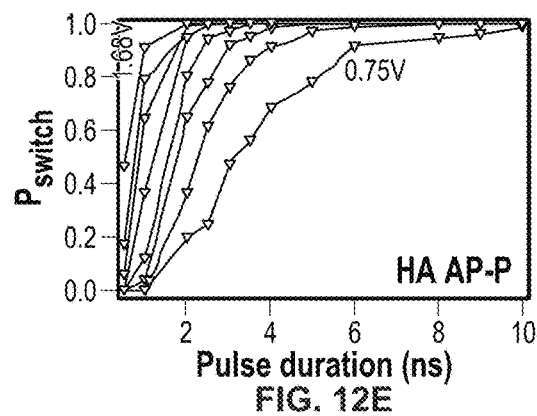
Figure 12F:
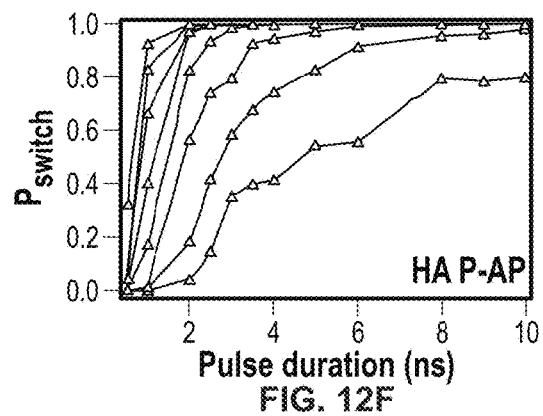

Pulsed voltage measurements are performed as described earlier in this patent document. The switching probability is measured for AP-to-P and P-to-AP polarities as a function of pulse voltage and pulse duration. For each sweep, the pulse voltage (applied with the appropriate sign for the AP-to-P or P-to-AP polarity) is set using the pulse generator's power attenuator which allows for 1 dB steps. At each combination of voltage and duration, 200 attempts are made to switch the device and the probability for switching over these attempts is recorded. FIGS. 12a to 12f present the acquired data, pulse voltage and pulse duration sweeps for switching probabilities, for each of the three Pt devices studied in this work. FIGS. 12a, 12c, and 12e show AP-to-P switching probabilities for LA, MA and HA devices and FIGS. 12b, 12d and 12f show P-to-AP switching probabilities for LA, MA and HA devices. The minimum and maximum pulse voltages used are indicated in the plots, with intermediate voltages incrementing in steps of 1 dB in power. The 50% probability switching times as shown in FIGS. 7b to 7d) are then calculated by linear interpolation between the two nearest measured pulse durations that span the 50% probability crossing, for each pulse voltage used.

Comparing Ta and Pt Spin-Hall Channels

Figure 13A:
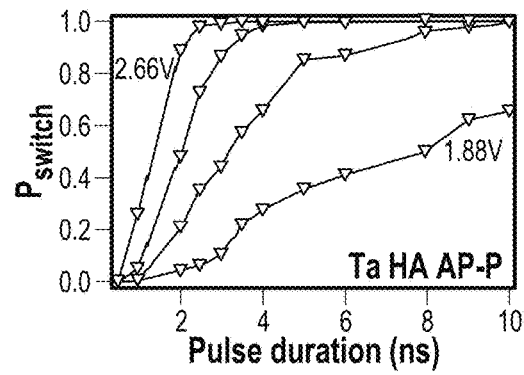
FIGS. 13a to 13d show examples of fast pulse characteristics of Ta spin-Hall channel HA devices.
Figure 13B:
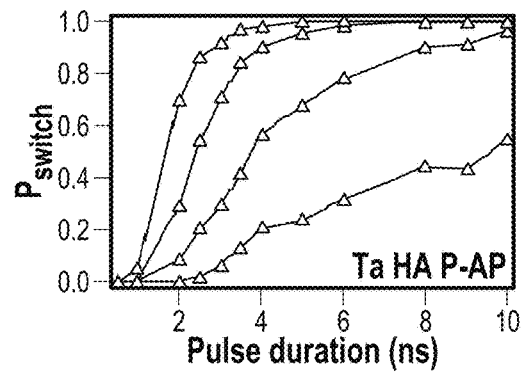
Figure 13C:
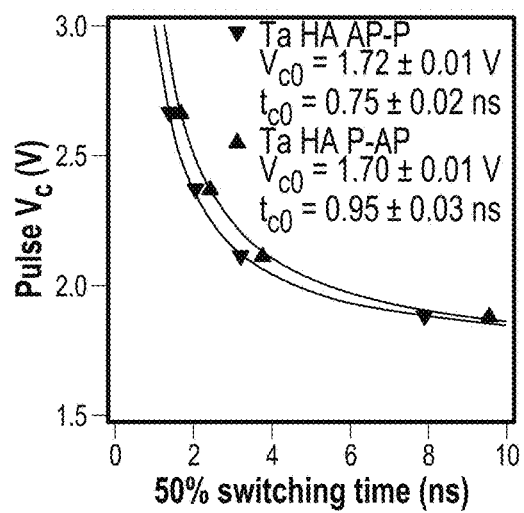
Figure 13D:
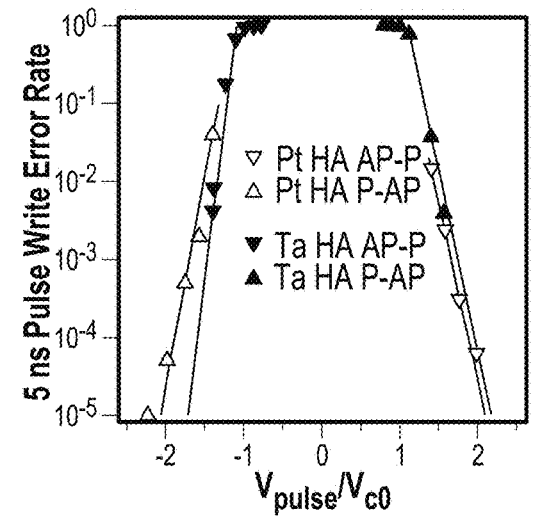

Fast pulse switching measurements of a Ta HA three-terminal device is performed for the comparison. The tantalum materials stack includes: ||SiOx|Ta(7)|FCB (1.8)|MgO (1.6)|FCB (3.5)|Ta (4)|Ru (4), with the numbers in parentheses indicating nanometers. The fabrication procedure is identical to the Pt device fabrication detailed in Methods section above. The HA device dimension is the same as the Pt HA device. FIGS. 13a to 13d show fast pulse characteristics of Ta spin-Hall channel HA device. The switching probability pulse sweep data is presented in FIGS. 13a and 13b for AP-to-P and P-to-AP switching. FIG. 13c shows summary of switching voltage versus 50% switching times, with macrospin fits overlaid. FIG. 13d shows comparison of the Ta and Pt HA device with 5 ns write error rates as a function of the normalized pulsed voltages. Similar to the Pt devices, the 50% switching time can be fitted well to the macrospin model, as shown in FIG. 13c.

Due to the different sign of the spin Hall ratio of Ta compared to that of Pt, the Oersted field points in the opposite direction for the Ta channel case compared to the Pt channel devices during switching, reinforcing the shape anisotropy. However, the $t_{c0}$ parameter is still very small (<1 ns), and comparable to the Pt devices. A slight asymmetry is observed in the $t_{c0}$ values, with the AP-to-P switching being slightly faster than the P-to-AP switching for the Ta case. This is opposite to the Pt case where the P-to-AP switching was slightly faster for the MA and LA devices. Together, these observations indicate that the Oersted field has a more subtle role than just augmenting or diminishing the anisotropy field in the device; the highly favorable switching times appear to be a more general feature of the three terminal device geometry.

Fast pulse switching measurements of samples of Pt-(thick ref) and Ta-(thick ref) devices were conducted.

Figures 14A, 14B:
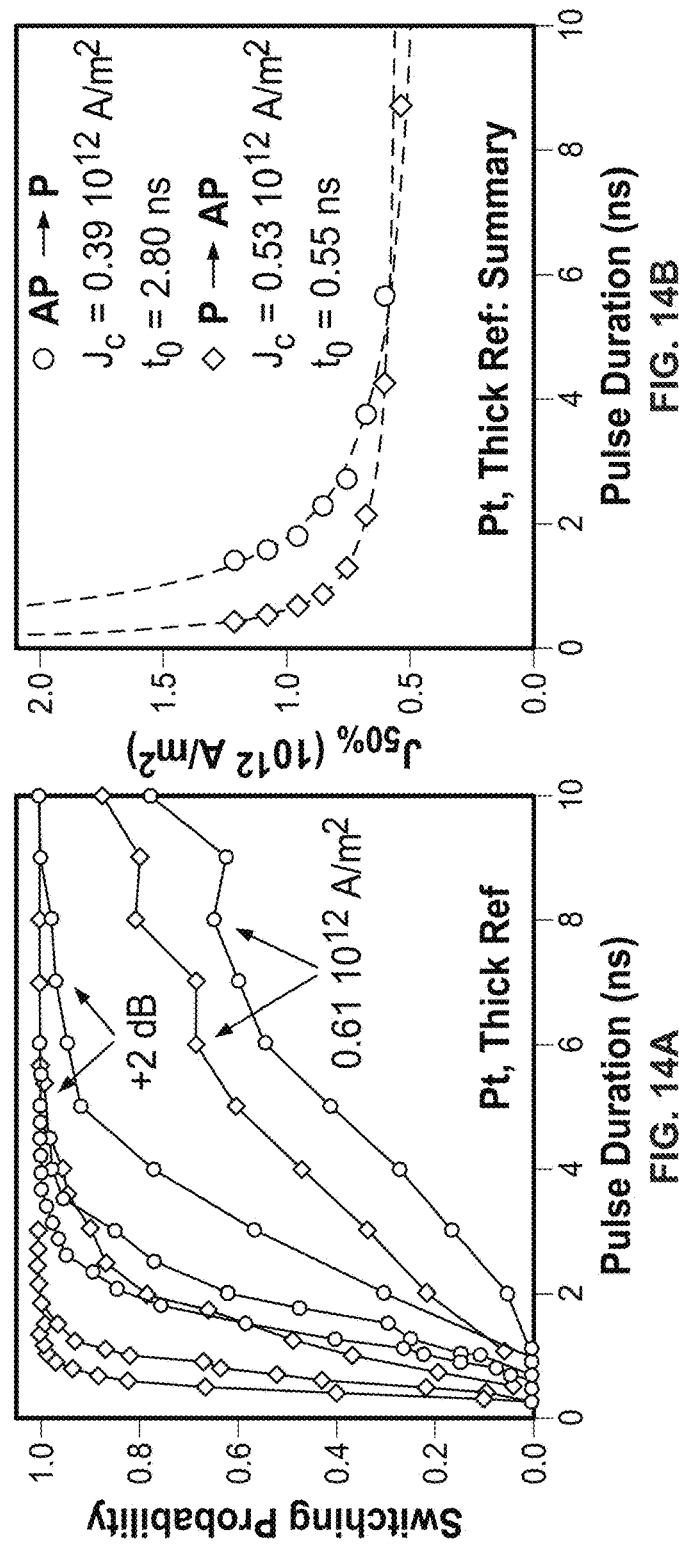
FIG. 14a depicts an example of switching probability as a function of the pulse duration.
FIG. 14b depicts an example of a plot of current density as a function of pulse duration.

FIG. 14a shows the measured switching probability as a function of the pulse amplitudes and durations for a Pt-(thick ref) device in the P→AP and AP→P polarities. In FIG. 14a, the diamonds indicate AP->P switching probabilities and the circles indicate P->AP switching probabilities, both vs. pulse τ for a Pt-(thick ref) device. Each trace is for a constant J applied using the pulse generator, in increments of 2 dB. Each point is averaged over 200 switching attempts. These data is summarized by extracting the interpolated pulse durations τ that result in 50% switching probability for each value of the current density J. These can then be fit to the macrospin model for anti-damping reversal, whereby $$J(\tau) = J_c(1 + \tau_0/\tau).$$  Eq. 4

Here, Jc is the critical switching voltage and $\tau_0$ the characteristic time at which switching is the most energy efficient. The Jc and $\tau_0$ values from all studied devices are summarized in Table 2, while the data and fits to Eq. 3 for a Pt-(thick ref) device are shown in FIG. 14b. Table 2 shows pulse switching characteristics from fits of Eq. 1 to experiments. The two entries marked by asterisks are poorly fit by Eq. 4.

edge profiles. The size of the asymmetry is less pronounced in Ta-(thick ref) compared to Pt-(thick ref) devices. As discussed below, these observations can be related to the different signs and strengths of the SHE in Pt and Ta.

Motivated by the influence of the micromagnetic non-uniformity on magnetic-field driven P→AP switching, simulations have been used to explore several scenarios for fast-pulse spin torque switching. In each scenario, the entire micromagnetic switching phase diagram including the full dynamic response of the RL was simulated at T=0 K. First, it is confirmed that the reversal characteristics of an isolated magnetic FL driven only by the SHE torque, not including the effects of $H_{Oe}$ from the applied current, are independent of the current polarity (data not shown). Next, an unpinned 3.0 nm thick RL that couples to the FL via the dipolar interaction (FIGS. 15a and 15b) is introduced. In this case, the characteristic Jc and τ0 of the two polarities diverged: while the AP→P transition proceeded in a relatively uniform manner the P→AP transition required an increased Jc and proceeded more slowly via complex micromagnetic dynamics that take place in both the FL and RL. These simulations are in conflict with the data of FIG. 14(b), where the P→AP transition appears greatly accelerated. However, upon introducing $H_{Oe}$ from the SHE channel in the simulations, a dramatic reduction in $\tau_0$ for P→AP switching is observed, as well as a commensurate reduction of the fine structure (FIGS. 15c and 15d). The small spurs visible in, e.g., FIGS. 15a and 15c are caused by the magnetization passing close to the hard-axis energy saddle point and are also present in macrospin simulations. Dashed lines show fits of Eq. 1 to the switching boundaries. In the case of Pt 3T-MTJ devices, the sign of the spin Hall torque is such that (for either sign of current) $H_{Oe}$ aids the switching driven by the SHE by helping to destabilize the initial state. Given the substantial P-state micromagnetic non-uniformity, the out-of-plane $-M \times H_{Oe}$ torque acts to quickly increase the magnitude of pre-switching dynamics in P→AP switching and thereby decrease their duration. On the other hand, the lack of an appreciable $-M \times H_{Oe}$ torque in the uniform AP state (where M∥H) leaves the AP→P transition largely unchanged with respect to τ0 and Jc, although inspection of individual transitions showed a more coherent reversal with HOe present. Those simulations suggest that, in the tested 3-ter-

TABLE 2

| Channel | Reference layer | AP→P | | P→AP | | |
| --- | --- | --- | --- | --- | --- | --- |
| | | $J_c$ ($10^{11}$ A/m²) | $\tau_0$ (ns) | $J_c$ ($10^{11}$ A/m²) | $\tau_0$ (ns) | $H_{dip}$ Oe |
| Ta | Thick | 4.7 ± 0.1 | 0.75 ± 0.03 | 4.7 ± 0.1 | 0.91 ± 0.03 | 130 |
| Pt | Thick | 3.9 ± 0.3 | 2.8 ± 0.4 | 5.3 ± 0.1 | 0.55 ± 0.02 | 200 |
| Pt | Pinned | 3.8 ± 0.2 | 2.3 ± 0.2 | 4.1 ± 0.3 | 1.4 ± 0.2 | 60 |
| Pt | SAF | 4.0 ± 0.4 | 1.8 ± 0.3 | 5.8 ± 0.4* | 0.47 ± 0.07 | 30 |
| Pt | SAF + weak pinning | 2.6 ± 0.1 | 2.9 ± 0.2 | 4.9 ± 0.4* | 0.51 ± 0.07 | 55 |
| Pt | SAF + strong pinning | 4.2 ± 0.4 | 1.17 ± 0.19 | 4.4 ± 0.5 | 1.18 ± 0.24 | 55 |

The large unexpected asymmetry in the switching timescales (τ0) between P→AP and AP→P polarities for this device is firstly focused. While it has been shown in simulations that non-ideal edge roughness profiles can alter the speed of reversal and introduce some polarity dependence into the switching speeds, this does not explain data since the P→AP switching is consistently faster than AP→P across all Pt-(thick ref) devices measured. Furthermore, the opposite tendency is observed in Ta-(thick ref) devices (faster AP→P switching), even though these have similar minal devices, the beneficial effect of $H_{Oe}$ occurs primarily during the initial early stages of the switching process—it only needs to be present in the simulation for the first 0.25 ns of the current pulse to facilitate fast P→AP reversal. Specifically, this implies that the biggest impact from the Oersted field occurs during the most critical time of the switching process; that is the initial part of the process. Without this beneficial effect, the large amplitude motion of free layer magnetization that is needed to complete the switching will take time to build up. Of course in an actual device the Oersted field is present during the full time that the electrical current is applied.

When testing the influence of $H_{Oe}$ by un-physically reversing its sign in the simulations, undesirable, highly non-uniform pre-switching dynamics that slow the switching was obtained, especially in the P→AP polarity (FIGS. 15e and 15f). This behavior is reminiscent of the "incubation delay" in STT switched 2-terminal MTJs, and also helps explain the experimental results with Ta-(thick ref) devices. The SHE in Ta is opposite in sign to Pt, so $H_{Oe}$ in this case acts to stabilize the initial state, thus opposing the SHE. In Table 2, AP→P switching in Ta-(thick ref) devices is marginally faster (since here the P→AP switching is slowed by $H_{Oe}$). However the effect is small since the increased magnitude of $\xi_{SH}=-0.12$ in Ta[21] compared to $\xi_{SH}=+0.08$ in Pt reduces the relative importance of $H_{Oe}$. Finally, a Pt device with a thinner (1.5 nm) but well-pinned RL ($H_{pin}=2$ kOe) was simulated, which resulted in a reduced dipolar field at the FL and a reduction of the P-state non-uniformity. In this case, a much closer correspondence of $J_c$ and $\tau_0$ across the two polarities (FIGS. 15g and 15h) was observed. However, $\tau_0$ was relatively long in both cases, >2 ns, which we attribute to the strong coercive field (~200 Oe) of the simulated FL and the lack of thermal effects. The simulations do show reliable sub-ns switching at sufficiently strong current pulses, though with a correspondingly reduced energy efficiency.

From these initial experimental results and simulations, micromagnetic non-uniformity in the FL of a 3-T MTJ device is conducive to fast and efficient STT driven reversal, with τ0<1 ns, provided $H_{Oe}$ generated by the current in the spin Hall channel is in the direction to encourage further deformation, i.e., opposite to the overall coercive field. As the result, large amplitude oscillations are quickly established, which suppresses the formation of localized non-uniform magnetic modes across the FL and speeds the overall reversal. When this non-uniformity is reduced, as in the AP state for a Pt-(thick ref) device, the reversal is slower although still fast and evidently devoid of an incubation delay.

Figure 16A:
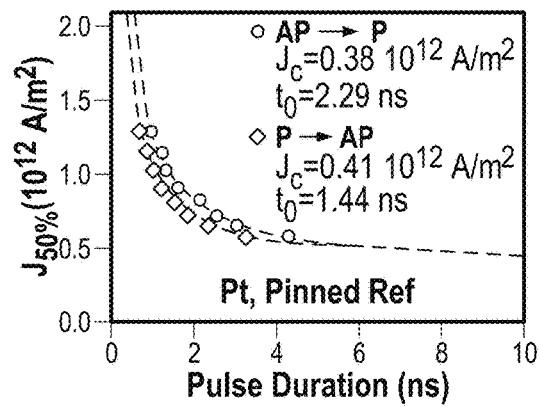
FIGS. 16a to 16d show examples of switching for various device types.
Figure 16B:
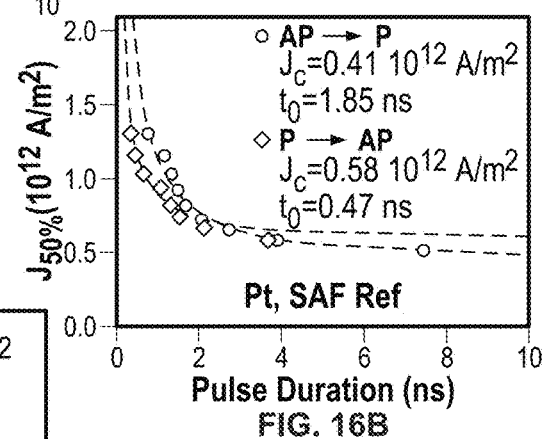
Figure 16C:
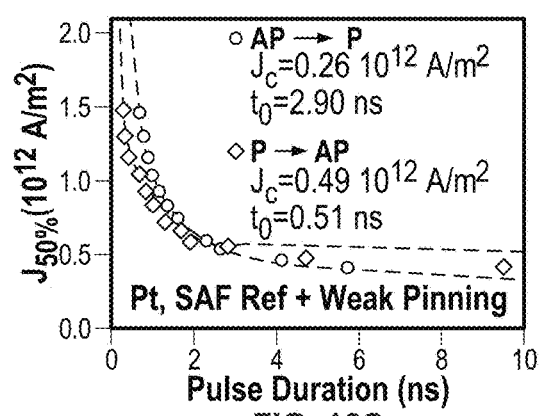
Figure 16D:
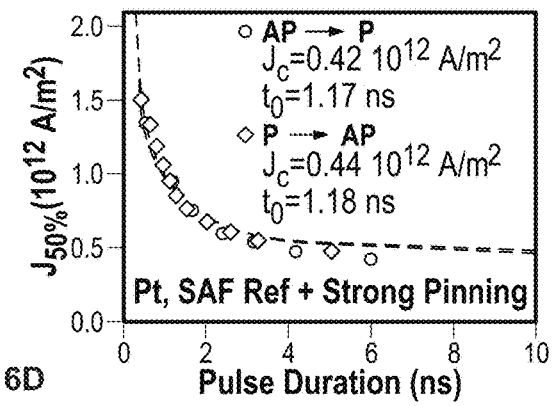

Based on these conclusions, it is expected that reducing dipole interactions between the magnetic layers and increasing the rigidity of the RL would reduce the asymmetry between the switching polarities, which is desirable in most applications, while still providing relatively fast switching in both directions. Therefore, Pt-based 3T-MTJ devices were fabricated with RLs of increasing complexity. FIGS. 16a to 16d show the switching summaries from four such device types: FIG. 16a is a Pt-(pinned ref) device with an exchange pinned RL, FIG. 16b is a Pt-SAF device with a SAF RL, and FIGS. 16c and 16d are two Pt-(SAF+pinning) devices with exchange pinned SAF RLs of two different pinning strengths. Compared to the Pt-(thick ref) device, the dipole field in the Pt-(pinned ref) sample was reduced by a factor of four, and in the Pt-SAF and Pt-(SAF+pinning) devices by an order of magnitude. While our SAF could be further fine-tuned, even if the average dipole moment were reduced to zero, there would still be significant non-uniform dipolar coupling to the FL. It is found that the Pt-(pinned ref) device yields a more symmetric $\tau_0$ compared to the Pt-(thick ref) sample, and can be well fit to the macrospin model of Eq. 3, implying more coherent switching dynamics (FIG. 16a). The Pt-SAF device also shows a more symmetric TO, but cannot be well fit to Eq. 4 (FIG. 16b). This is likely due to dynamics originating in the thin, weakly pinned RL. In the two Pt-(SAF+pinning) devices, the strength of the pinning was varied by annealing the devices in different strengths of magnetic field. In the first case (the Pt-(SAF+weak pinning) device), the device was deliberately annealed in a low (0.15 T) field to weaken the exchange pinning while still establishing a preferred direction for the RL (FIG. 16c). In the second case (Pt-(SAF+strong pinning)), a high (0.5 T) field was used to provide a stronger exchange pinning (FIG. 16d). The Pt-(SAF+weak pinning) device exhibits switching characteristics similar to those of the Pt-SAF sample, while the Pt-(SAF+strong pinning) sample shows a τ0 of approximately 1 ns in both polarities. Since the weakly pinned SAF still supports coupled RL/FL dynamics, a very strong pinning is needed to prevent this detrimental behavior. Finally, in all cases, the switching timescales for P→AP and AP→P switching converge in response to longer pulses, even if the macrospin fits do not capture this fact. This is because the initial dynamics are less important over longer timescales.

The conducted test results demonstrated robust ns-timescale reversal of 3T-MTJ devices utilizing spin Hall torque from both a Ta and Pt channel. Extremely fast switching, with a characteristic reversal time $\tau_0 \ll 1$ ns, can be obtained when there is substantial micromagnetic non-uniformity in the FL and the pulsed Oersted field is in the direction that encourages switching, making the formation of localized magnetic deformations within the FL less likely during reversal. If the direction of $H_{Oe}$ is reversed in the simulations, switching takes substantially longer and becomes highly non-uniform. Since the FL micromagnetics vary substantially between the P and AP configuration in MTJs with weakly pinned thick RLs, the switching speeds in that case are quite different between P→AP and AP→P reversal. With reduced FL micromagnetic non-uniformity courtesy of a SAF RL, and strong pinning that minimizes RL oscillations, somewhat slower (but still fast) switching with $\tau_0 \sim 1$ ns is obtained since the $H_{Oe}$ still promotes uniform and reliable reversal. The understanding of the fast switching dynamics reported here could provide opportunities for additional optimization of 3T-MTJs through explicit exploitation of micromagnetic effects. This would further enhance the attractiveness of 3T-MTJs, with their separation of low impedance write and high impedance read paths, for applications requiring fast switching.

Figure 17B:
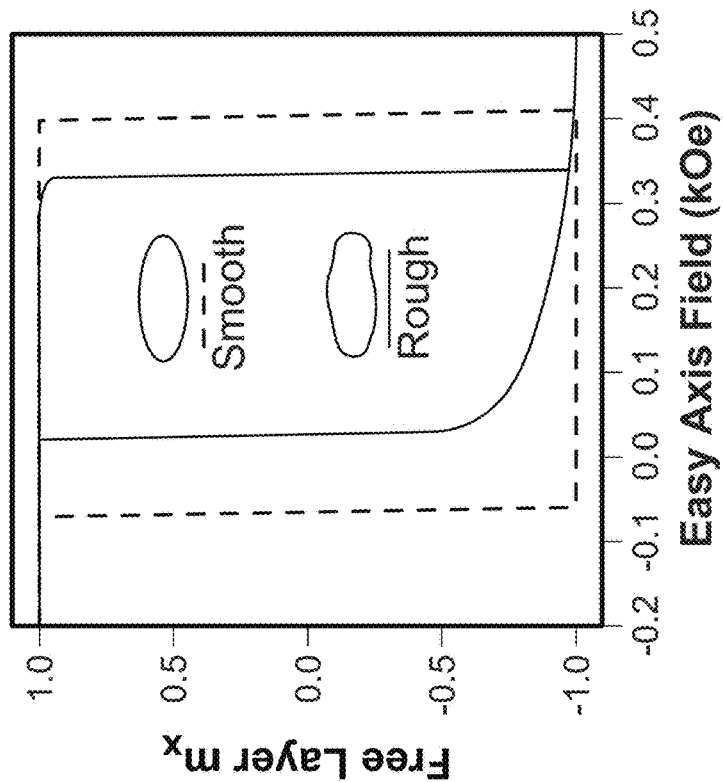
FIG. 17b shows an example of a simulated hysteresis loops for the free layer/reference layer system with a smooth (dotted lines) and rough (solid lines) edge profile.
Figure 17A:
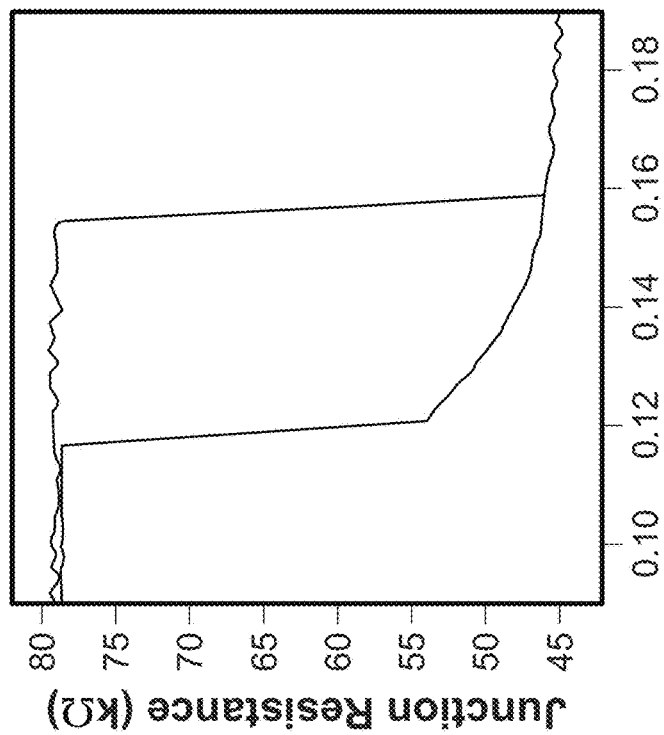
FIG. 17a shows an example of a measured hysteresis loop of a sample with a thick FeCoB(4) reference layer.

Referring to FIGS. 17a and 17b, the prominent curvature of the P state resistance for devices with a thick FeCoB(4) reference layer is discussed. FIGS. 17a and 17b suggest the development of a micromagnetic state in either or both of the magnetic layers. Accordingly, the T=0 K micromagnetic reversal curves were simulated for the devices. For the free layer, the saturation magnetization, Ms=1550×103 A/m and perpendicular anisotropy field, Hk=9700 Oe were used, which were obtained in nearly identical devices in Nguyen et al. Appl. Phys. Lett. 106, 222402 (2015). The reference layer was assumed to posess the same Ms but no perpendicular anisotropy. An exchange constant $A=2\times10^{-11}$ J/m$^3$ and a (1.5 nm)$^3$ cubic spatial discretization was assumed. All layer thicknesses were rounded to the nearest multiple of 1.5 nm. The hysteresis curves were calculated for devices with a perfectly elliptical 60×180 nm$^2$ cross-section (within the constraints of the cell size), as well as for devices with a rough edge profile computed directly from SEM images of our devices.

In devices with a smooth elliptical profile, the simulations produced abrupt AP->P and P->AP transitions consistent with a Stoner-Wohlfarth reversal, as seen in FIG. 17b. The introduction of pinning sites along the edges allowed the magnetization to gradually bend away from the uniform state. In the P state the magnetizations scissor away from one another in order to reduce their mutual dipole energy, as seen in FIG. 5d. In the AP state, however, the stray fields from either layer saturated the other layer such that this curvature was minimized as seen in FIG. 5(e).

Accordingly, a sharp AP->P transition was still observed while the opposite transition maintains a substantial curvature. This behavior resulted in an asymmetric hysteresis loop, also shown in FIG. 17b, consistent with that observed in experiments. As mentioned in the main text, the use of a pinned and SAF reference layer stacks results in a reduced stray field (either by virtue of reduced thickness or intentional field cancellation). Thus, relatively hysteresis loops are restored, such as that seen for an SAF reference layer in FIG. 5c. In these systems, as the curvature is reduced the micromagnetic behavior becomes less important.

Given the $\sin^\theta$ angular dependence of spin torque and the notable micromagnetic curvature observed in simulations of magnetostatic reversal, it is surmised that micromagnetics will play an important role in the nature of fast reversal by the SHE. As such, simulations of spin-torque induced magnetization reversal are performed using the same parameters mentioned above (including the rough edge profile), assuming a spin Hall effect strength $\xi_{SH}$=+0.08 similar to that observed in our samples, and taking a damping value $\alpha$=0.016 measured on continuous films using flip-chip FMR. Furthermore, assume that there is no field-like component of the spin torque from the SHE. The inclusion of the as-of-yet neglected Oersted field from the SHE channel can be used to identify the source of switching timescale asymmetry. A uniform magnetic field $H_{Oe}=\mu_0 J t \hat{x}/2$ calculated from the current density J and channel thickness is assumed. The same micromagnetic system starting from stable configurations at the center of the calculated hysteresis loops (220 Oe) is evolved. The simulated current pulses (which are inputs to both the Oersted field and SHE) are given linear rising and falling slopes of 65 and 100 ps, respectively, in approximate accordance with the pulse shapes used in the experimental system.

FIGS. 15a to 15f are the results of simulations using a reference layer thickness of 3.0 nm. This thickness is reduced to 1.5 nm for FIGS. 15g and 15h, which reduces the required offset field to around 120 Oe. A pinning field of 2 kOe (corresponding to the measured pinning strength of our "strongly pinned" devices) is applied to the reference layer only. Each phase diagram is calculated using an adaptive refinement method to identify the fine structure of the switching phase boundary—a rectilinear scan of this phase space could easily miss such complexity. Spur-like features evident in many of the phase diagrams of FIGS. 15a to 15h can also be observed in macrospin simulations and are caused by the magnetization passing close to the hard-axis energy saddle point. Magnetization precession slows near the saddle point (and more generally near the separatrix dividing in- and out-of-plane orbits), leading to failed switching attempts and interesting features in the phase diagrams. Switching phase diagrams from macrospin simulations of an isolated magnetic free layer are shown in FIGS. 18a and 18b for comparison. FIG. 18a shows simulation of T=0 K macrospin dynamics, indicating similar spurs as in the micromagnetic simulations and FIG. 18b shows simulations at T=4 K indicating that these features are washed out by small thermal energy scales. As seen in FIG. 18b, these spurs are eliminated when macrospin simulation are performed at T=4 K. Finite temperature micromagnetic phase diagrams was not calculated given the formidable computational burden for doing so, but they should resemble blurred versions of the diagrams seen in FIGS. 15a to 15h.

Figures 19A, 19B, 19C:
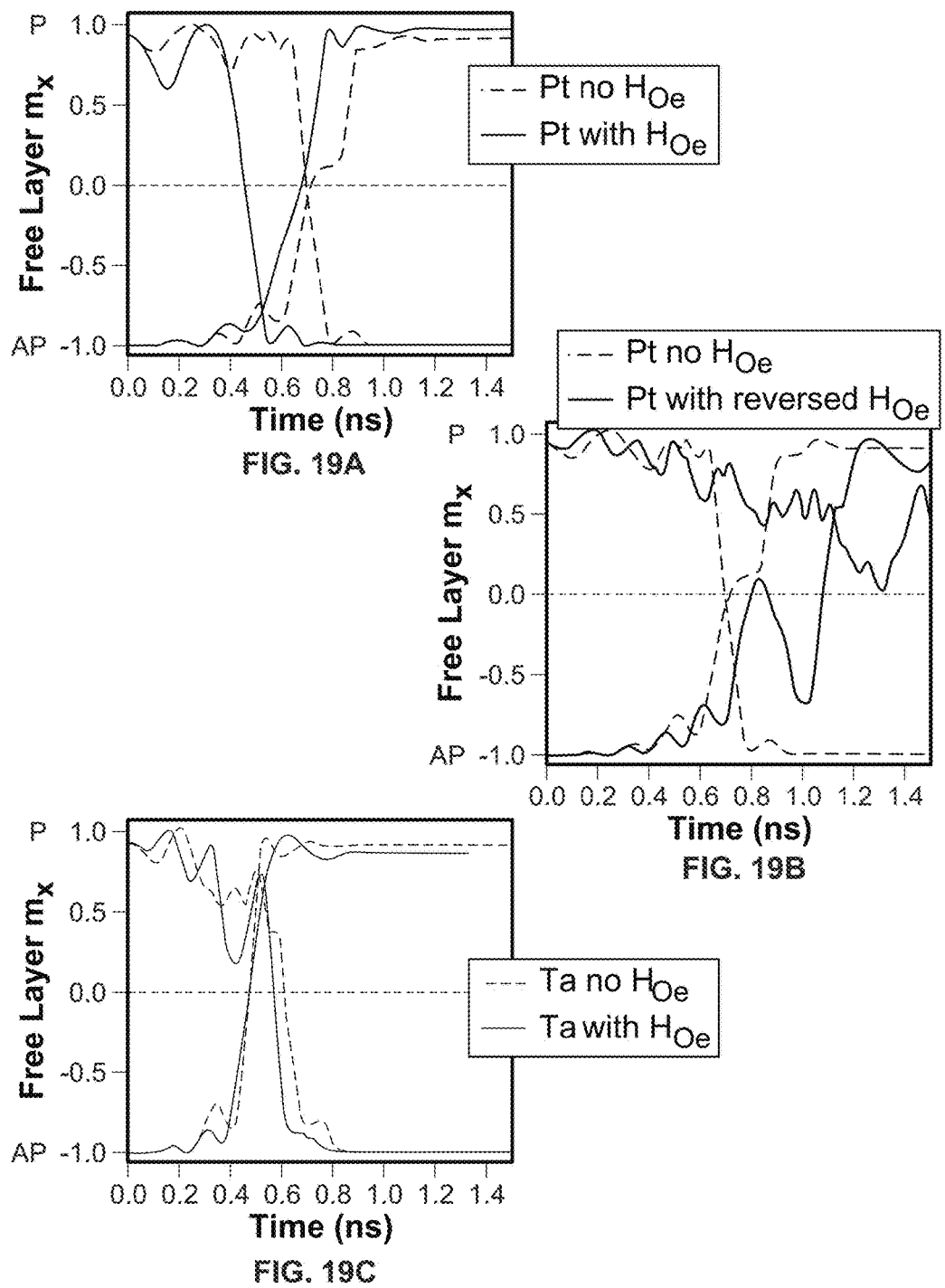
FIGS. 19a to 19c show a comparison of reversal trajectories with and without the Oersted field.

While the phase diagrams of FIGS. 15a to 15h provide an overview of the complex switching behavior in this system, FIGS. 19a to 19c show some example trajectories that demonstrate the manner in which the field influences switching dynamics. For a system with a thick reference layer and no pinning, a large current density J=2.5×10$^{11}$ A/m$^2$ is applied, which is linearly ramped up in 65 ps and left on for the remainder of the simulation. This current results in fast reversal, which is examined with and without including the Oersted field from the write channel.

In FIG. 19a, the P→AP transition for Pt devices is seen to become markedly faster under the influence of $H_{Oe}$. The magnetization crosses the hard-axis saddle-point one full oscillation earlier than it otherwise would. Meanwhile, the AP→P transition remains essentially unchanged in terms of speed. Since it appears that the Oersted field has the greatest impact in the early stages of the dynamics, simulations are run where the Oersted field is turned off after some time $\tau_{Oe}$ less than the duration of the current pulse. For the P→AP transition, that $H_{Oe}$ needs to be left on for approximately 0.25 ns to provide switching assistance akin to that seen in FIG. 19a, otherwise the dynamics are largely unaffected. This confirms that the Oersted field contributes to the switching primarily through a large initial torque. In FIG. 19b, reversing the sign of the Oersted field for Pt devices ($\xi_{SH}$=−0.08) has a profound impact on the switching dynamics. The dynamics become notably more complex and there is a substantial delay before AP→P finally occurs. The P→AP transition is completely suppressed under these conditions. In FIG. 19c, in Ta devices, $H_{Oe}$ has comparatively little impact on the dynamics. This is because of the increased $\xi_{SH}$=−0.12 in Ta, which renders $H_{Oe}$ 50% weaker in relative terms. Nevertheless, the P state reversal is slightly delayed, which is the expected result of the Oersted field stymying switching in the P→AP direction. Finally, it is worth noting that switching in Pt devices with $H_{Oe}$ approaches the speed of switching in Ta devices for the same current density—yet another benefit of choosing Pt as the spin Hall channel material.

For memory applications, the control circuit in the 3-terminal MTJ device can be specifically configured to be operable in a writing mode to simultaneously apply the charge current in the spin Hall effect metal layer and the gate voltage across the MTJ to set or switch the magnetization direction of the free magnetic layer to a desired direction for representing a stored bit, and, in a read mode, the control circuit is operable to apply a read voltage to the first electrical terminal to supply a read current tunneling across the MTJ between the first electrical terminal and the spin Hall effect metal layer, without switching the magnetization direction of the free magnetic layer, to sense the magnetization direction of the free magnetic layer that represents the stored bit in the MTJ.

The disclosed technology can be implemented in various configurations to provide one or more characteristics based on the specific needs of the applications. Some examples of such characteristics are provided below.

Low energy switching and reading operations: Much effort has been spent on reducing the critical current required to switch a thin film nanomagnet with spin transfer torque or spin Hall torque. This has been primarily performed with slowly varying currents which do not capture the characteristic timescale for switching. For magnetic free layers with in-plane magnetization, it has previously been argued that there is a ~10 ns delay before the current induced switching process is initiated. However, our demonstration of ~1 ns switching without initial delays points to a highly efficient mechanism for current induced switching. Since the energy required for a switching event is directly proportional to the timescale for switching, there is an order of magnitude improvement in the energy efficiency for the write process.

Notably, the three-terminal geometry for the device separates the read and write pathways. This design can utilize thick insulating barriers that result in robust magnetoresistance signals without causing damage to the insulator. This implies that the energy and time required for the read operation is also minimal. Together, the nanosecond-timescale switching, the large magnetoresistance signal enable and the non-volatile nature of the three-terminal spin Hall effect (3T-SHE) devices represent a promising practical memory device for computing.

Figure 20:
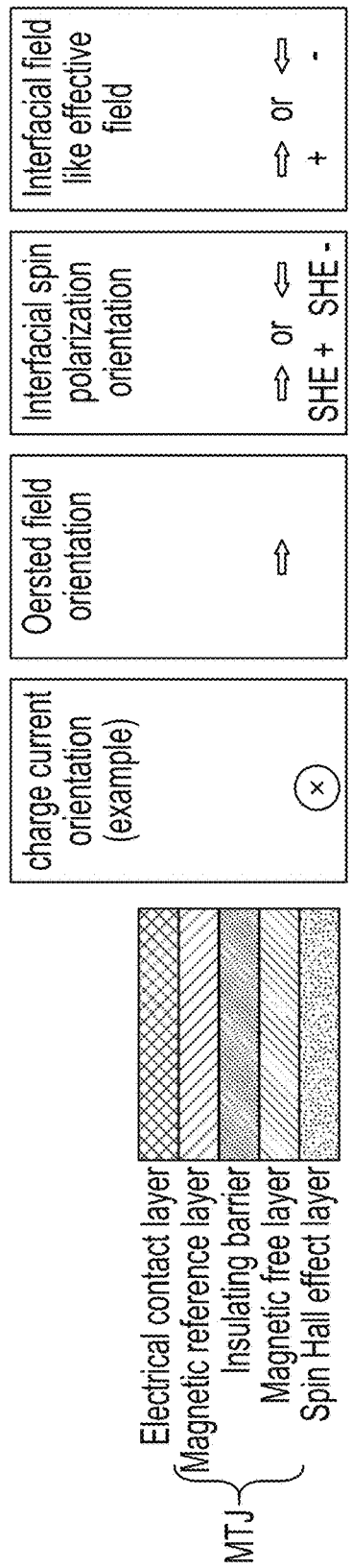
FIG. 20 shows a schematic representation of an orientation of critical vectors during current induced switching of a magnetic free layer.

Materials selection: The selection of materials in the multilayer stacks as well as the optimization of their interfaces is critical to obtain fast switching. FIG. 20 shows the various possibilities for the orientations of the critical vector parameters when a charge current is flowing (into the plane of the paper in this example). The orientation of the Oersted field that is generated by this charge current flow is largely parallel to the plane of the film layers, as determined by Ampere's law. However, the orientation of the interfacial spin polarization has two possibilities depending on the sign of the spin Hall angle of the heavy metal material that generates the transverse spin current that exerts anti-damping spin torque on the ferromagnetic layer. As the result if the spin Hall angle of the heavy metal material is negative, as it is for Ta and W for example, then the Oersted field will be in the direction to strengthen the in-plane anisotropy field of the magnetic free layer, and hence hinder the anti-damping spin torque driven reversal. However the effect of the impinging spin current and/or that potion of the charge current that flows longitudinally along at the interface of the spin Hall metal layer with the magnetic layer will also result, due to spin-orbit electronic interactions at the interface, in a separate in-plane effective magnetic field being exerted on the switchable free magnetic layer. (For a discussion of this "spin-orbit generated effective magnetic field" see Ou, Y., Pai, C. F., Shi, S., Ralph, D. C., Buhrman, R. A., "Origin of field-like spin-orbit torques in heavy metal/ferromagnet/oxide thin film heterostructures," *Physical Review B* (94), 14, 2016.) This effective field is oriented in the plane of the magnetic layer and is largely collinear with the Oersted field. However this effective field can have two possible orientations, dependent on the sign of the spin Hall angle of the heavy metal spin Hall effect layer, and on the details of the interface between the spin Hall effect layer and the magnetic free layer. The strength of this effective field is also dependent upon the strength of the transverse spin current and the details of the interface between the spin Hall effect metal and the magnetic free layer. Thus if the orientation of the Oersted field generated by the charge current pulse is the direction adverse to enhancing the fast switching of the magnetic free layer as it is for, in some cases, a spin Hall metal with a negative sign, if this spin-orbit generate effective field is large enough it can dominate and provide the beneficial effect of the Oersted field that is obtained with the use of a spin Hall metal with a positive spin Hall angle, such as in the Pt case demonstrated here.

The most commonly used spin Hall effect materials are platinum (Pt), tantalum (Ta) and tungsten (W) due to their giant spin Hall effect, and alloys and compounds of these elements. Specifically, Pt has a moderate and positive spin Hall angle, Ta has a moderate and negative spin Hall angle, and W has a relatively large and negative spin Hall angle. This implies that the relative importance of the Oersted field is greatest in the case of Pt and Ta since relatively larger currents are required to switch an otherwise identical magnetic free layer compared to W. Further, depending on the sign of the field-like effective field the overall in-plane effective field—the combination of the Oersted and field-like vectors—will vary based on the spin Hall effect layer and the magnetic free layer.

It is found that in the Pt case the Oersted field that is generated during the switching event has a significant and beneficial impact on the switching speed. For the test structures characterized so far, it is also known that the field-like effective field is negligible. Therefore, in the Pt-FeCoB system, the Oersted in-plane effective field enables fast switching in both current polarities.

In other materials stacks: In Ta—FeCoB system, the Oersted field and the field-like effective field are of the similar magnitude. In W—FeCoB system, the Oersted field is expected to play a small role since the spin Hall angle is relatively large and therefore the Oersted field generated by the smaller critical switching current is correspondingly smaller. However, the field-like effective field is large and of the opposite orientation compared to the Oersted field. Therefore W—FeCoB is an attractive material system where significantly reduced switching speeds might be obtained.

Since Pt alloys and compounds, and alloys and compounds of other heavy metals can have higher spin Hall angles than that of pure Pt, the effective field generated by the spin current in those cases can also be larger and dominate over the Oersted field generated by the electrical current. The use of thin insertion layers, less than one to more than four atomic layers in thickness, at the interface between the spin Hall effect metal and the magnetic free layer can also vary the relative strength and sign of the spin current generated effective field relative to that of the Oersted field. Hence interfacial material changes can be employed to obtain the desired sign and maximize the amplitude of the effective field to promote ultra-fast spin Hall device switching.

Based on the above findings, the spin Hall effect and/or the insertion layer can be chosen in various manners to obtain desired switching characteristics. In some implementations, the choice of the spin Hall effect material may be made to cause the in-plane effective magnetic field that is generated by the current pulse to be in the direction more or less opposite to the in-plane coercive field of the second magnetic layer. In some implementations, the choice of the insertion layer may be made to cause the in-plane effective magnetic field that is generated by the current pulse to be in the direction more or less opposite to the in-plane coercive field of the second magnetic layer. In some implementations, the choice of the spin Hall effect material is made to cause the net sum of the current-generated Oersted magnetic field and the current-generated in-plane effective magnetic field that is due to the incident spin current and/or to interfacial spin-orbit effects to be oriented in opposition to the in-plane magnetic anisotropy field of the free magnetic layer. In some implementations, the choice of the insertion layer is made to cause the net sum of the current-generated Oersted magnetic field and the current-generated in-plane effective magnetic field that is due to the incident spin current and/or to interfacial spin-orbit effects to be oriented in opposition to the in-plane magnetic anisotropy field of the free magnetic layer.

20. Another possible claim: The device of claim 10 and claim 11 where the choice of the insertion layer is made to cause the net sum of the current-generated Oersted magnetic field and the current-generated in-plane effective magnetic field that is due to the incident spin current and/or to interfacial spin-orbit effects to be oriented in opposition to the in-plane magnetic anisotropy field of the free magnetic layer.

Figure 21:
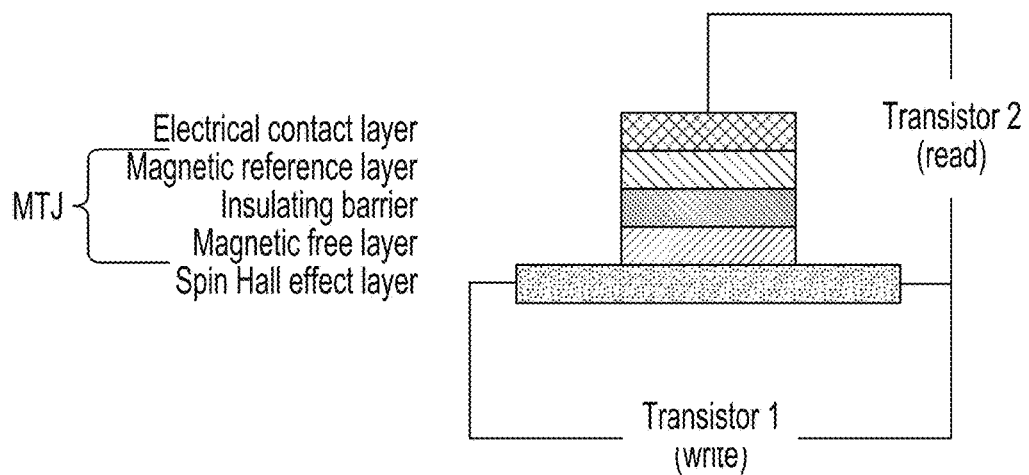
FIG. 21 shows a schematic representation of a three-terminal MTJ device with a SHE layer employed to perform a writing operation and a read operation.

Circuit implications: FIG. 21 shows a schematic representation of a three-terminal MTJ device with a SHE layer employed to perform a writing operation and a read operation. FIG. 21 specifically shows a write operation transistor 1 as part of the SHE circuit shown in FIG. 2 and a read operation transistor 2 as part of the MTJ circuit in FIG. 2. When reading a MTJ, the write operation transistor 1 is turned off so no charge current is directed into the SHE metal layer under the MTJ while the read operation transistor 2 is turned on to allow a reading of the resistance of the MTJ without changing the magnetization direction of the free layer in the MTJ. When a write operation is performed, the write operation transistor 1 is turned on to supply a charge current into the SHE metal layer that is sufficiently large to cause sufficient injection of spin-polarized electrons or particles into the free layer to switch its magnetization direction to a desired direction for a data bit to be written into the MTJ. In some implementations, the read operation transistor 2 may also be turned on in such a writing operation to provide the gated voltage across the MTJ stack to facilitate the switching. The few tens of nanoseconds switching times for STT MRAM devices leads to their potential application as next-generation non-volatile alternative to the DRAM. However, our demonstration of nanosecond-timescale switching speed makes 3T-SHE devices competitive next-generation alternatives to the fastest class of memory known as SRAM. In addition to the non-volatile character of MRAM, 3T-SHE devices also require two transistors as shown in FIG. 21 for the operation of one bit, as opposed to four to six needed for SRAM. This means that the footprint for the physical devices can be significantly reduced enabling much faster SRAM modules for cache memories closer to the computing logic units.

The disclosed technology can be implemented in various configurations and applications.

For example, the spin Hall effect can be used for nanosecond-timescale and sub-nanosecond-timescale, low write error switching of an in-plane magnetic free layer which is part of a magnetic tunnel junction (MTJ) in a three-terminal geometry.

In some implementations, the following features can be included: (1) The three terminal geometry that includes a thin film channel of material with a large spin-Hall effect, such as Pt, Ta, W or other heavy metallic elements and their alloys and compounds; (2) A MTJ is situated atop this channel and a current transmitted in the channel causes a spin current to impinge on the magnetic free layer that is in contact with the channel; (3) the magnetic tunnel junction is an elliptical or other shaped nanoscale structure consisting of a "free magnetic layer", a tunneling barrier and a "reference magnetic layer"; and (4) Very low write error rates with 2 ns and shorter pulses can be obtained with this device, with many avenues for further improvements using the methods described here.

In other implementations, the fast speed of switching based on the disclosed technology can be achieved beyond the expected 'macrospin' model-based theoretical limits, and can deliver superior performance. Spin-transfer-torque (STT) memories are currently being actively explored with in-plane and perpendicularly magnetized free layers for commercial applications. For in-plane magnetized MTJs, the estimate from theoretical models suggest switching timescales that are >>1 ns. It has been common perception in recent years that the perpendicularly magnetized MTJs will show the fastest switching. However, fastest reported values in literature for reliable switching in perpendicularly magnetized STT MTJs are for 4 ns pulses. Spin-Hall switching of perpendicularly magnetized free layers is also being explored, but one challenge is that some spin-Hall fast switching devices use an external magnetic field to operate reliably.

The disclosed technology can be used to enhance the speed of the anti-damping spin transfer torque switching by the spin Hall generated spin current by a simultaneously generated pulsed magnetic field torque stemming from the in-plane magnetic field, generated by the Oersted effect by the charge current flow in the spin-Hall channel. Alternatively, a pulse magnetic field-like torque can be generated by a spin-orbit-generated effective field that exerts a field-like torque on the ferromagnetic layer due to the incident spin current. Such a field-like torque can also be generated by the Rashba-Edelstein effect arising from a strong spin-orbit interaction at the heavy metal-ferromagnetic interface. In some implementations, a field torque can also be generated by a combination of both the magnetic field torque and the field-like spin-orbit torque acting together: the Oersted field is a result of the charge current flowing in the spin Hall channel, and no other mechanism or structure is needed to provide this field, and both the Oersted field and the field-like torque are only present when the pulse current is transmitted through the channel, so it does not alter or deteriorate the magnetic state of the free layer, thereby preserving long term non-volatile memory storage.

In implementations, the Oersted field can be tuned by: varying the thickness of the spin Hall channel material, thereby changing the current density overall; varying the geometrical shape of the spin Hall channel, thereby locally changing the current density; altering the materials that comprises the spin-Hall channel, thereby modifying the strength of the field at a given current with respect to the spin current generated by the channel; modifying the interface between the spin Hall channel and the free layer, thereby modifying the efficiency of the spin current with respect to the transmitted current flow; or choosing materials with either positive or negative signs for their spin Hall angle, thereby affecting the symmetry, parallel or antiparallel, of the Oersted field compared to the initial magnetic state of the free layer.

In some implementations, the field-like torque generated by a spin-orbit effect can be tuned and enhanced by modification of the interface between the heavy metal spin Hall channel and the ferromagnetic layer. For example, the insertion of a different metal layer, of thickness of approximately one to four atomic layers, can be used to modify the spin mixing conductance of the interface to result in more reflection of the incident spin current in a manner that will generate a stronger field-like torque on the ferromagnetic free layer. In some implementations, this insertion of a different metal layer may be less than a few atomic layers and may have an effective thickness of less than one atomic layer to a few atomic layers in some designs. For another example, the material at the surface of the spin Hall channel and the material at adjacent surface of the magnetic free layer material can be selected such that there is a strong spin-orbit interaction at the interface resulting in a strong Rashba-Edelstein effect, or some other effect, that will exert a strong field-like torque on the magnetic free layer.

In implementations, the speed of switching may be controlled through the geometrical control of the free layer. For elliptically shaped MTJs, for example, reducing the anisotropy field by lowering the aspect ratio of the MTJs can result in significantly faster switching. Other geometrical effects can be utilized to enhance the speed of the magnetic switching. For example, the shapes for the MTJ can be utilized to take advantage of effects stemming from the micromagnetic non-uniformities in the initial states that will give rise to a high initial torque on the free layer that speeds the magnetic reversal under the combination of the anti-damping spin transfer torque and the magnetic field torque and possibly a field-like spin orbit torque. For example, variations in the geometry of the spin-Hall channel and in its composition can be employed to create non-uniformities in the spin current that is incident on the free layer, and hence initiate a non-uniform response that will speed the full reversal process. For yet another example, the current for switching the free layer can be lowered by reducing the thickness of the free layer, in order to obtain a higher surface perpendicular magnetic anisotropy that reduces the effective magnetization of the free layer without affecting its long term stability.

While this patent document and attached Appendices A through E contain many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Only a few implementations and examples are described and other implementations, enhancements and variations can be made based on what is described and illustrated in this patent document.

What is claimed is:

1. A device based on a spin Hall effect (SHE) and spin transfer torque (STT) effect, comprising:
   a magnetic structure including a ferromagnetic layer having a magnetization direction that can be changed by spin transfer torque and being shaped with a spatial anisotropy profile with a low aspect ratio less than 1:4 in a plane parallel to the ferromagnetic layer;
   a SHE layer that is electrically conducting and exhibits a spin Hall effect to, in response to an applied charge current, generate a spin-polarized current that is perpendicular to the applied charge current, the SHE layer located adjacent to the ferromagnetic layer to inject the spin-polarized current into the ferromagnetic layer;
   a first electrical contact in contact with the magnetic structure;
   a second electrical contact in contact with a first location of the SHE layer;
   a third electrical contact in contact with a second location of the SHE layer so that the first and second locations are on two opposite sides of the magnetic structure and are separate from each other along a charge current direction along which the applied charge current flows in the SHE layer, wherein the second location for the third electrical contact is selected so that the charge current direction is parallel to a short axis of the spatial anisotropy profile of the magnetic structure;
   a magnetic structure circuit coupled between the first electrical contact and one of the second and third electrical contacts to supply a current or a voltage to the magnetic structure;
   and a charge current circuit coupled between the second and third electrical contacts to supply the charge current into the SHE layer,
   wherein the device is operable at a low write error rate less than $10^{-5}$ with pulses of a pulse duration of around 2 ns or shorter to switch a direction of the magnetization direction of the ferromagnetic layer in the magnetic structure.

2. The device of claim 1, further comprising:
   a first transistor connected to the first electrical contact and the second electrical contact and configured to be operable in a writing mode; and
   a second transistor connected to the second electrical contact and the third electrical contact and configured to be operable in a read mode.

3. The device of claim 1, wherein the SHE layer includes a heavy metal with a spin Hall angle that allows to change the magnetization direction of the ferromagnetic layer within few tens of nanosecond switching time.

4. The device of claim 1, wherein the SHE layer includes platinum (Pt), tantalum (Ta), or tungsten (W), or an alloy of Pt, Ta, or W, or a compound of Pt, Ta, or W.

5. The device of claim 1, wherein the SHE layer includes PtMn, PtCr, PtTa, PtNb, or PtZr.

6. The device of claim 1, further including a metallic insertion layer formed between the SHE layer and the ferromagnetic layer and having a thickness of less than approximately one to four atomic layers.

7. The device of claim 6, wherein the metallic insertion layer includes Hf, Y, Al, Zr, Ti, Mo or Nb.

8. The device of claim 1, wherein the magnetic structure further includes a reference layer having a fixed magnetization direction and a non-magnetic layer disposed between the ferromagnetic layer and the reference layer.

9. The device of claim 8, wherein the reference layer includes a synthetic antiferromagnetic (SAF) structure.

10. The device of claim 8, wherein the reference layer is pinned by an adjacent antiferromagnetic layer.

11. The device of claim 1, wherein the ferromagnetic layer has a micromagnetic non-uniformity reduced as compared to when there is no spin-polarized current injected into the ferromagnetic layer.

12. A device based on a spin Hall effect (SHE) and spin transfer torque (STT) effect, comprising:
   a magnetic tunneling junction (MTJ) structure including a first magnetic layer having a fixed magnetization direction, a second magnetic layer having a changeable magnetization direction, and a non-magnetic junction layer between the first magnetic layer and the second magnetic layer;
   a SHE layer formed adjacent to the second magnetic layer and including a spin Hall effect material with strong spin orbit coupling sufficient to generate a spin current and apply a spin transfer torque effect to the second magnetic layer under a given charge current applied into the SHE layer, wherein the spin Hall effect material includes a heavy metal with a spin Hall angle that affects an orientation of an in-plane effective field generated by the spin current to change the magnetization direction of the second magnetic layer within tens of nanosecond switching time; and
   a charge current circuit coupled to two different contact locations on the SHE layer to inject the given charge current to flow between the two different contact locations in a charge current direction defined by the two different contact locations on the SHE layer, wherein the MTJ structure is shaped to have a spatial anisotropy profile with a short axis to be parallel to the charge current direction and a low aspect ratio less than 1:4 in a plane parallel to each of the non-magnetic junction layer and the first and the second magnetic layers and to have a write error rate less than less than $10^{-5}$.

13. The device of claim 12, where the choice of the spin Hall effect material is to cause in-plane effective magnetic field to be in the direction more or less opposite to an in-plane coercive field of the second magnetic layer.

14. The device of claim 12, further including an insertion layer disposed between the SHE layer and the second magnetic layer to provide an optimized interface for the change of the magnetization direction of the second magnetic layer.

15. The device of claim 14, wherein the choice of the insertion layer is made to cause the in-plane effective magnetic field to be in the direction more or less opposite to the in-plane coercive field of the second magnetic layer.

16. The device of claim 14, wherein the insertion layer has a thickness of less than approximately one atomic layer to four atomic layers.

17. The device of claim 14, wherein the insertion layer includes Hf, Y, Al, Zr, Ti, Mo or Nb.

18. The device of claim 12, wherein the SHE layer includes platinum (Pt), tantalum (Ta), or tungsten (W), or an alloy of Pt, Ta, or W, or a compound of Pt, Ta, or W.

19. The device of claim 12, wherein the SHE layer includes PtMn, PtCr, PtZr, PtTa, PtNb, or PtZr.

20. The device of claim 12, wherein the in-plane effective field has a strength dependent upon a strength of the spin current and an interface between the SHE layer and the second magnetic layer.

21. The device of claim 12, wherein the first magnetic layer includes a synthetic antiferromagnetic (SAF) structure.

22. The device of claim 12, wherein the first magnetic layer is pinned by an adjacent antiferromagnetic layer.

23. The device of claim 12, wherein the second magnetic layer has a micromagnetic non-uniformity reduced as compared to when there is no spin-polarized current injected into the ferromagnetic layer.

24. The device of claim 12, wherein the choice of the spin Hall effect material is made to cause the net sum of the current-generated Oersted magnetic field and the current-generated in-plane effective magnetic field that is due to the spin current and/or to interfacial spin-orbit effects to be oriented in opposition to the in-plane magnetic anisotropy field of the second magnetic layer.

25. The device of claim 12, wherein the choice of the insertion layer is made to cause the net sum of the current-generated Oersted magnetic field and the current-generated in-plane effective magnetic field that is due to the incident spin current and/or to interfacial spin-orbit effects to be oriented in opposition to the in-plane magnetic anisotropy field of the free magnetic layer.

26. The device of claim 12, wherein the second magnetic layer comprises conductor materials including Pt, Pd, Nb, Mo, Ru, Re, Os, Ir, Au, Tl, Pb, Hf, or Bi, an alloy or a compound thereof.

27. The device of claim 12, wherein the SHE layer has a curved shape.

28. A method for switching a magnetization direction of a free magnetic layer of a magnetic tunneling junction (MTJ) structure coupled to a spin Hall effect (SHE) metal layer based on a spin transfer torque (STT) effect, comprising:

coupling a SHE metal layer to a second magnetic layer having a changeable magnetization direction to allow a current to flow from the SHE metal layer to the second magnetic layer, wherein the second magnetic layer is in a magnetic tunneling junction (MTJ) structure including a first magnetic layer having a fixed magnetization direction, the second magnetic layer and a non-magnetic junction layer between the first magnetic layer and the second magnetic layer, wherein the MTJ structure is shaped to have a spatial anisotropy profile with a low aspect ratio less than 1:4 in a plane parallel to each of the non-magnetic junction layer and the first and the second magnetic layers; and applying a charge current into the SHE metal layer along a charge current direction that is parallel to a short axis of the spatial anisotropy profile of the MTJ structure to generate a spin-polarized current that is perpendicular to the applied charge current based on a spin Hall effect in the SHE metal layer and to effectuate an in-plane magnetic field in the second magnetic layer to change the magnetization direction of the second magnetic layer based on a spin transfer torque (STT) effect within tens of nanosecond switching time to have a write error rate less than less than $10^{-5}$.

29. The method as in claim 28, further comprising applying a second current to follow through the MTJ structure to assist the change of the magnetization direction of the second magnetic layer based on a spin transfer torque (STT) effect, wherein the second current is below a threshold current amplitude and is insufficient to cause the change of the magnetization direction of the second magnetic layer alone without the applied charge current into the SHE metal layer.

* * * * *